United States Patent
Ma et al.

(10) Patent No.: US 8,207,453 B2
(45) Date of Patent: Jun. 26, 2012

(54) GLASS CORE SUBSTRATE FOR INTEGRATED CIRCUIT DEVICES AND METHODS OF MAKING THE SAME

(75) Inventors: Qing Ma, Saratoga, CA (US); Quan A. Tran, Fremont, CA (US); Robert L. Sankman, Phoenix, AZ (US); Johanna M. Swan, Scottsdale, AZ (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 245 days.

(21) Appl. No.: 12/653,710

(22) Filed: Dec. 17, 2009

(65) Prior Publication Data
US 2011/0147055 A1    Jun. 23, 2011

(51) Int. Cl.
*H01L 21/02* (2006.01)

(52) U.S. Cl. ........ 174/262; 174/265; 361/762; 361/771; 361/793; 257/432; 257/729; 257/E21.002; 438/123; 438/667

(58) Field of Classification Search .......... 174/252–267; 257/677, 686, 698, 700–727, 734, 758, 516; 361/760–768; 29/825–852; 428/209, 210
See application file for complete search history.

(56) References Cited

U.S. PATENT DOCUMENTS

| | | | |
|---|---|---|---|
| 4,221,047 A | 9/1980 | Narken et al. | |
| 4,639,543 A | 1/1987 | Fang | |
| 4,975,103 A | 12/1990 | Ackermann et al. | |
| 5,294,238 A | 3/1994 | Fukada et al. | |
| 5,705,855 A | 1/1998 | Carson et al. | |
| 6,156,413 A | 12/2000 | Tomari et al. | |
| 6,177,707 B1 | 1/2001 | Dekker et al. | |
| 6,194,762 B1 | 2/2001 | Yamazaki et al. | |
| 6,309,901 B1 | 10/2001 | Tahon et al. | |
| 6,339,197 B1 * | 1/2002 | Fushie et al. ................... | 174/262 |
| 6,539,750 B1 | 4/2003 | Takagi et al. | |

(Continued)

FOREIGN PATENT DOCUMENTS

JP    2001-053191 A    2/2001
(Continued)

OTHER PUBLICATIONS

"Schott Hermes", NEC SCHOTT Components Corporation Japan, Copyright 2009, 1 page.
(Continued)

*Primary Examiner* — Michail V Datskovskiy
(74) *Attorney, Agent, or Firm* — Winkle, PLLC

(57) ABSTRACT

Disclosed are embodiments of a glass core substrate for an integrated circuit (IC) device. The glass core substrate includes a glass core and build-up structures on opposing sides of the glass core. Electrically conductive terminals may be formed on both sides of the glass core substrate. An IC die may be coupled with the terminals on one side of the substrate, whereas the terminals on the opposing side may be coupled with a next-level component, such as a circuit board. The glass core may comprise a single piece of glass in which conductors have been formed, or the glass core may comprise two or more glass sections that have been joined together, each section having conductors. The conductors extend through the glass core, and one or more of the conductors may be electrically coupled with the build-up structures disposed over the glass core. Other embodiments are described and claimed.

13 Claims, 15 Drawing Sheets

U.S. PATENT DOCUMENTS

| | | | |
|---|---|---|---|
| 6,673,698 B1 | 1/2004 | Lin et al. | |
| 6,691,409 B2 * | 2/2004 | Suzuki et al. | 29/852 |
| 6,772,514 B2 | 8/2004 | Ogura et al. | |
| 6,799,438 B2 | 10/2004 | Herzbach et al. | |
| 6,839,946 B2 | 1/2005 | Ylilammi et al. | |
| 6,894,358 B2 | 5/2005 | Leib et al. | |
| 6,989,604 B1 | 1/2006 | Woo et al. | |
| 7,038,309 B2 | 5/2006 | Hsu et al. | |
| 7,071,521 B2 | 7/2006 | Leib et al. | |
| 7,072,018 B2 | 7/2006 | Yamamura et al. | |
| 7,091,589 B2 * | 8/2006 | Mori et al. | 257/686 |
| 7,259,080 B2 | 8/2007 | Quenzer et al. | |
| 7,279,771 B2 * | 10/2007 | Sunohara et al. | 257/516 |
| 7,285,834 B2 | 10/2007 | Leib et al. | |
| 7,337,540 B2 | 3/2008 | Kurosawa | |
| 7,362,403 B2 | 4/2008 | Uehara | |
| 7,476,623 B2 | 1/2009 | Schreder et al. | |
| 7,749,900 B2 * | 7/2010 | Li et al. | 438/667 |
| 7,993,510 B2 * | 8/2011 | En | 205/296 |
| 2002/0038725 A1 * | 4/2002 | Suzuki et al. | 174/262 |
| 2002/0145197 A1 * | 10/2002 | Ohta et al. | 257/734 |
| 2002/0159243 A1 * | 10/2002 | Ogawa et al. | 361/760 |
| 2005/0012217 A1 | 1/2005 | Mori et al. | |
| 2008/0149384 A1 * | 6/2008 | Kawabe | 174/265 |
| 2008/0283277 A1 * | 11/2008 | Muramatsu et al. | 174/250 |
| 2009/0174065 A1 | 7/2009 | Hayashi et al. | |
| 2009/0273073 A1 | 11/2009 | Tachibana et al. | |
| 2010/0164030 A1 * | 7/2010 | Oggioni et al. | 257/432 |

FOREIGN PATENT DOCUMENTS

WO      2011/084235 A2      7/2011

OTHER PUBLICATIONS

"Mems Tightly Sealed With Schott Hermes", SCHOTT Electronic Packaging, Jul. 30, 2009, Webpage (Retrieved Dec. 9, 2009), available at: http://www.us.schott.com/epackaging/english/news/press.html?NID=2609.

Onezawa, Yutaka et al. "NEC Schott introduces Glass Substrates with Hermetic Metal Through Vias for WLP of MEMS & Sensor applications", Aug. 7, 2009, Webpage (Retrieved Dec. 9, 2009), available at: http://www.i-micronews.com/interviews/NEC-Schott-Glass-Substrates-Hermetic-Metal-Through-Vias-WLP,57.html.

"Schott Hermes Substrate", Webpage (Retrieved Dec. 9, 2009), available at: http://www.nec-schott.co.jp/english/auto/others/hermes.html?PHPSESSID=r4nmcg11d95hgugh5r253hq3d3.

International Search Report and Written Opinion received for PCT Application No. PCT/US2010/056310, Mailed on Jun. 30, 2011, 9 pages.

\* cited by examiner

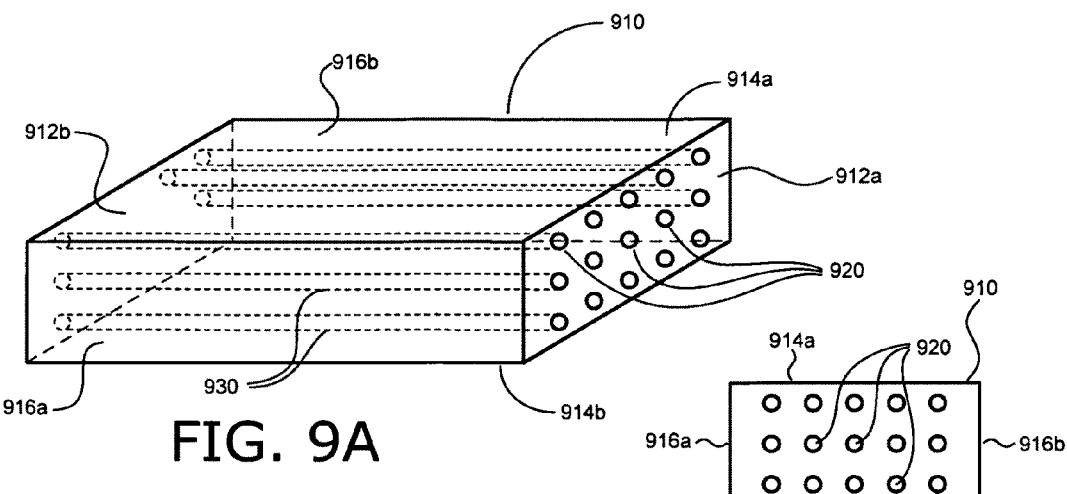
FIG. 9A
FIG. 9B
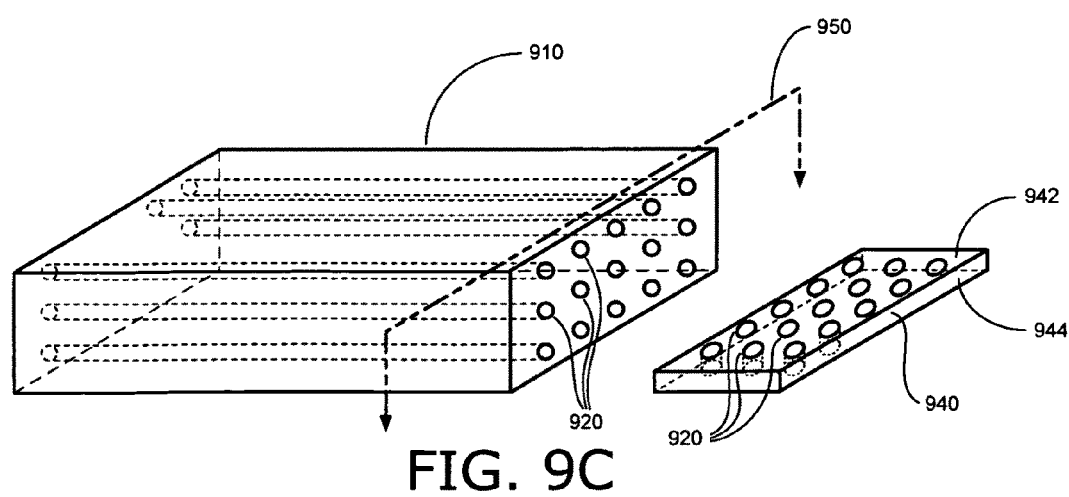
FIG. 9C

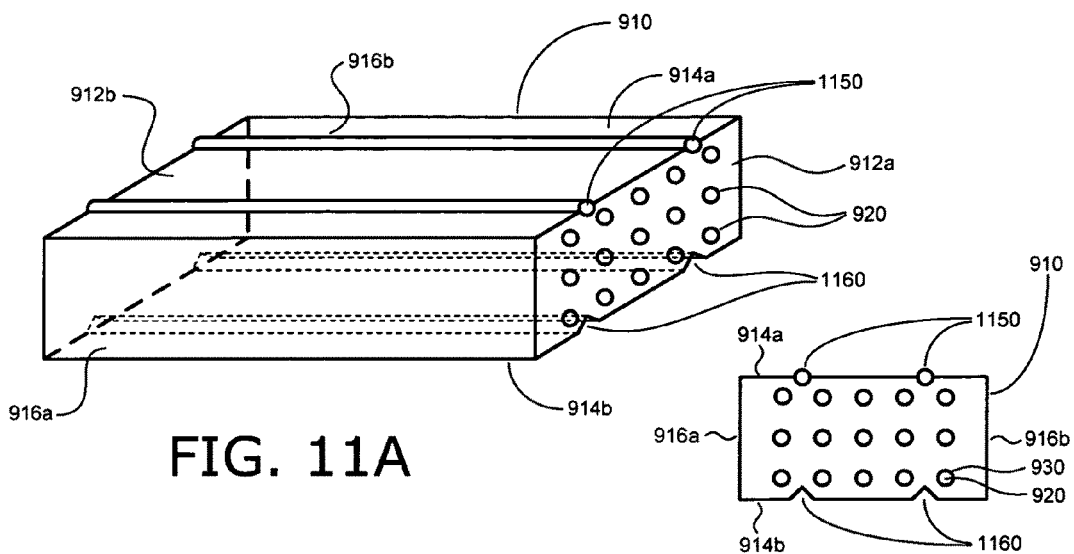
FIG. 11A
FIG. 11B
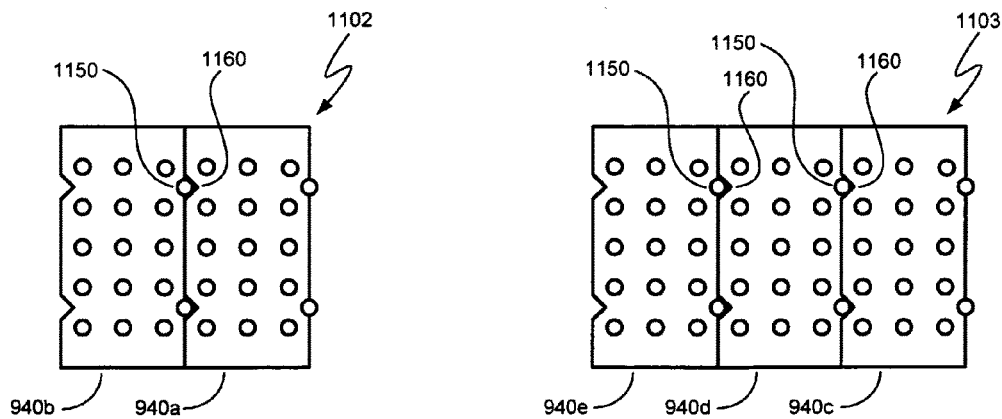
FIG. 11C
FIG. 11D

GLASS CORE SUBSTRATE FOR INTEGRATED CIRCUIT DEVICES AND METHODS OF MAKING THE SAME

RELATED APPLICATIONS

This application is related to application Ser. No. 12/653,722 entitled "Substrate for Integrated Circuit Devices Including Multi-Layer Glass Core and Methods of Making the Same", filed on even date herewith.

FIELD OF THE INVENTION

The disclosed embodiments relate generally to substrates for integrated circuit devices, and more particularly to a substrate having a glass core.

BACKGROUND OF THE INVENTION

An integrated circuit (IC) die may be disposed in a package to support the die, as well as to aid in forming electrical connections between the die and a next-level component, such as a motherboard, mainboard, or other circuit board. The package typically includes a substrate to which the die is both mechanically and electrically coupled. For example, the IC die may be coupled to the substrate by an array of interconnects in a flip-chip arrangement, with a layer of underfill disposed around the interconnects and between the die and substrate. Each of the interconnects may comprise a terminal on the die (e.g., a bond pad, a copper pillar or stud bump, etc.) that is electrically coupled (e.g., by reflowed solder) to a mating terminal (e.g., a pad, pillar, stud bump, etc.) on the substrate. Alternatively, by way of further example, the IC die may be attached to the substrate by a layer of die attach adhesive, and a plurality of wire bonds may be formed between the die and substrate.

The IC die is disposed on one side of the substrate, and a number of electrically conductive terminals are formed on an opposing side of the substrate. The terminals on the opposing side of the substrate will be used to form electrical connections with the next-level component (e.g., a circuit board), and these electrical connections can be used to deliver power to the die and to transmit input/output (I/O) signals to and from the die. The electrically conductive terminals on the substrate's opposing side may comprise an array pins, pads, lands, columns, bumps etc., and these terminals may be electrically coupled to a corresponding array of terminals on the circuit board or other next-level component. The terminals on the package substrate's opposing side may be coupled to the next-level board using, for example, a socket (and retention mechanism) or by a solder reflow process.

BRIEF DESCRIPTION OF THE DRAWINGS

FIG. 9A is a schematic diagram showing a perspective view of an embodiment of a glass body having embedded metal wires.

FIG. 9B is a schematic diagram showing a side elevation view of the glass body with embedded metal wires shown in FIG. 9A.

FIG. 9C is a schematic diagram showing a perspective view of the cutting of a slice from the glass body of FIGS. 9A-9B.

FIG. 11A is a schematic diagram showing a perspective view of another embodiment of a glass body having embedded metal wires and alignment elements.

FIG. 11B is a schematic diagram showing a side elevation view of the glass body with embedded metal wires and alignment elements, as shown in FIG. 11A.

FIGS. 11C-11D are schematic diagrams illustrating embodiments of the joining of two or more slices from the glass body of FIGS. 11A-11B.

DETAILED DESCRIPTION OF THE INVENTION

Figure 1A:
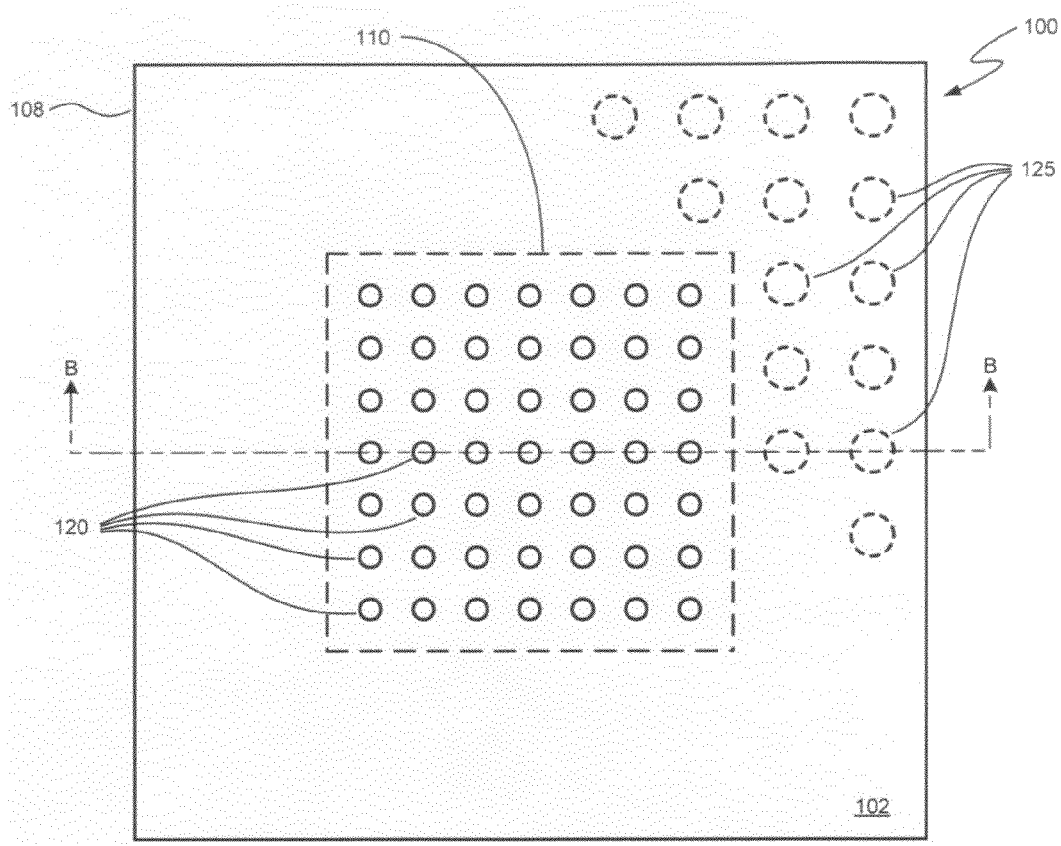
FIG. 1A is a schematic diagram showing a plan view of one embodiment of a glass core substrate.

Disclosed are embodiments of a substrate having a glass core. One or more build-up layers may be disposed on each side of the glass core, and electrical conductors extend through the glass core. The glass core may comprise a single piece of glass, or in other embodiments the glass core comprises two or more sections of glass that have been joined together. Embodiments of methods of forming a glass core substrate having conductors extending through the glass core's thickness are described below. Also disclosed are embodiments of an assembly including an integrated circuit die disposed on a glass core substrate and coupled with the substrate by a set of interconnects.

As noted above, the disclosed embodiments encompass a substrate having a core comprised of glass. According to one embodiment, the term "glass" refers to an amorphous solid. Examples of glass materials that may be used with the described embodiments include pure silica (e.g., approximately 100% SiO2), soda-lime glass, boro-silicate glass, and alumo-silicate glass. However, the disclosed embodiments are not limited to silica-based glass compositions, and glasses having alternative base materials (e.g., fluoride glasses, phosphate glasses, chalcogen glasses, etc.) may also be employed with the disclosed embodiments. Further, any combination of other materials and additives may be combined with silica (or other base material) to form a glass having desired physical properties. Examples of these additives include not only the aforementioned calcium carbonate (e.g., lime) and sodium carbonate (e.g., soda), but also magnesium, calcium, manganese, aluminum, lead, boron, iron, chromium, potassium, sulfur, and antimony, as well as carbonates and/or oxides of these and other elements. The aforementioned glasses and additives are but a few examples of the many types of materials and material combinations that may find application with the disclosed embodiments. In addition, a glass body may include surface treatments and/or coatings to improve strength and/or durability, and a glass body may also be annealed to lower internal stresses.

Generally, as used herein, the term "glass" does not refer to organic polymer materials, which may be amorphous in solid form. However, it should be understood that a glass according to some embodiments may include carbon as one of the material's constituents. For example, soda-lime glass, as well as numerous variations of this glass type, comprise carbon.

A glass, once formed into a solid body, is capable of being softened and perhaps remelted into a liquid form. The "glass transition temperature" of a glass material is a temperature below which the physical properties of the glass are similar to those of a solid and above which the glass material behaves like a liquid. If a glass is sufficiently below the glass transition temperature, molecules of the glass may have little relative mobility. As a glass approaches the glass transition temperature, the glass may begin to soften and with increasing temperature the glass will ultimately melt into the liquid state. Thus, a glass body may be softened to an extent sufficient to enable manipulation of the body's shape, allowing for the formation of holes or other features in the glass body.

According to one embodiment, the "softening temperature" of a glass is temperature at which the glass has softened to an extent sufficient to enable the disclosed embodiments to be performed. For example, in one embodiment, the softening temperature of a glass is the temperature at which the glass is sufficiently soft to allow for formation of holes or other features in the glass by an imprinting technique (to be described below in greater detail). The glass transition and softening temperatures are unique properties of a glass, although two or more different glass materials may have similar glass transition and/or softening temperatures. Further, it should be understood that the glass transition temperature and softening temperature of a particular glass may not necessarily be the same value.

Figure 1B:
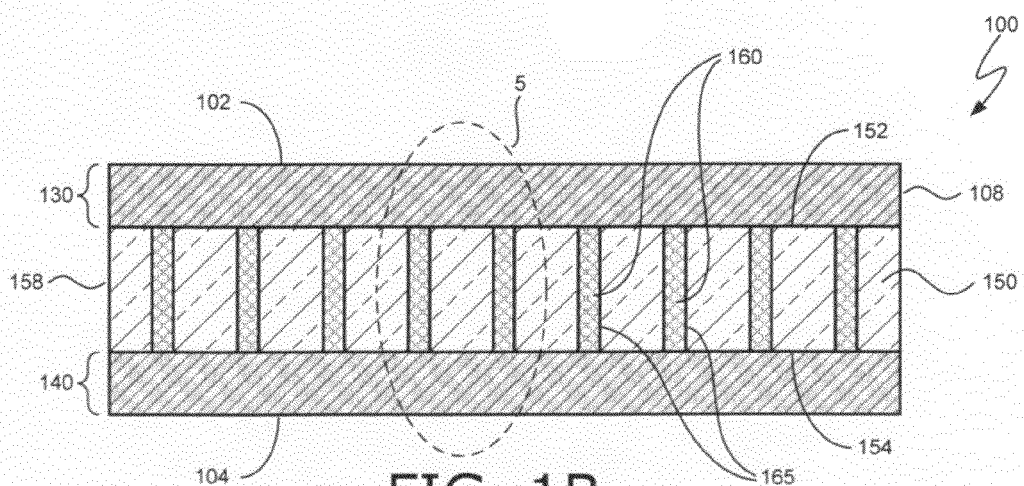
FIG. 1B is a schematic diagram showing a cross-sectional elevation view of the glass core substrate of FIG. 1A, as taken along line B-B of FIG. 1A.
Figure 1C:
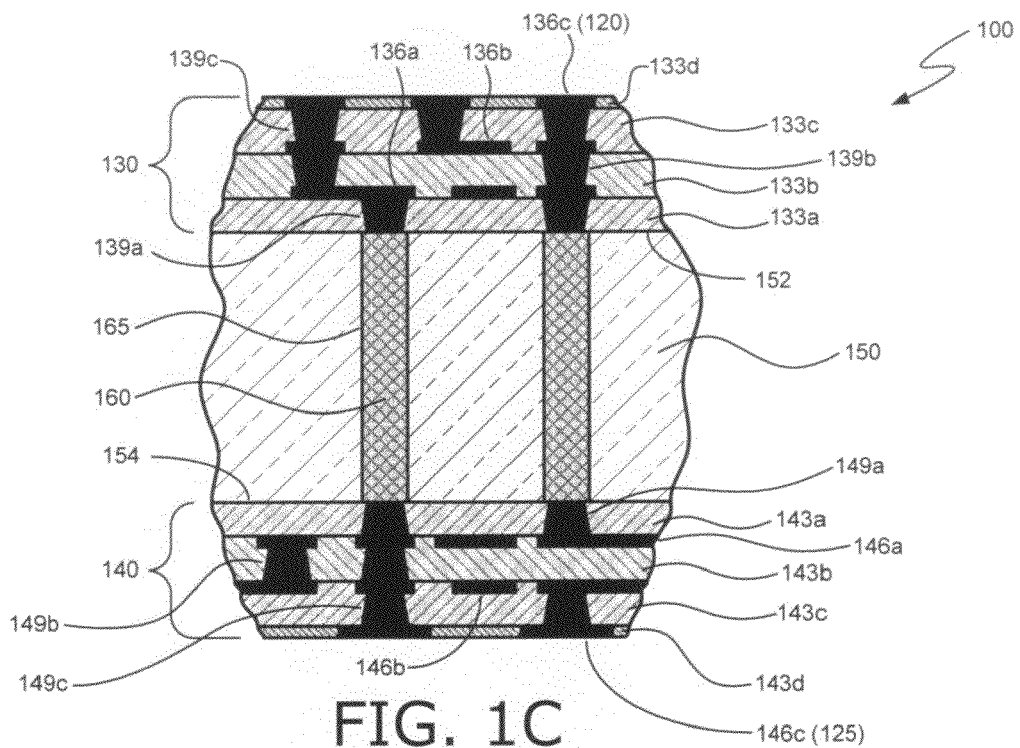
FIG. 1C is a schematic diagram showing a portion of the cross-sectional elevation of FIG. 1B and illustrating another embodiment of a glass core substrate.
Figure 1D:
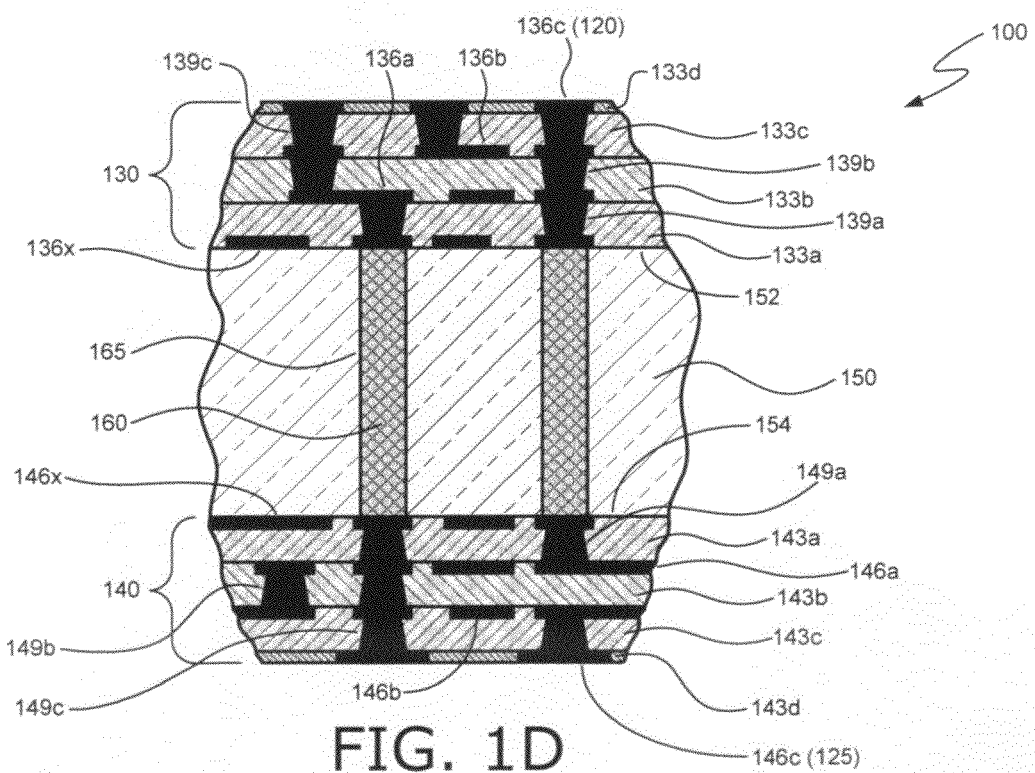
FIG. 1D is a schematic diagram showing a portion the cross-sectional elevation of FIG. 1B and illustrating a further embodiment of a glass core substrate.
Figure 1E:
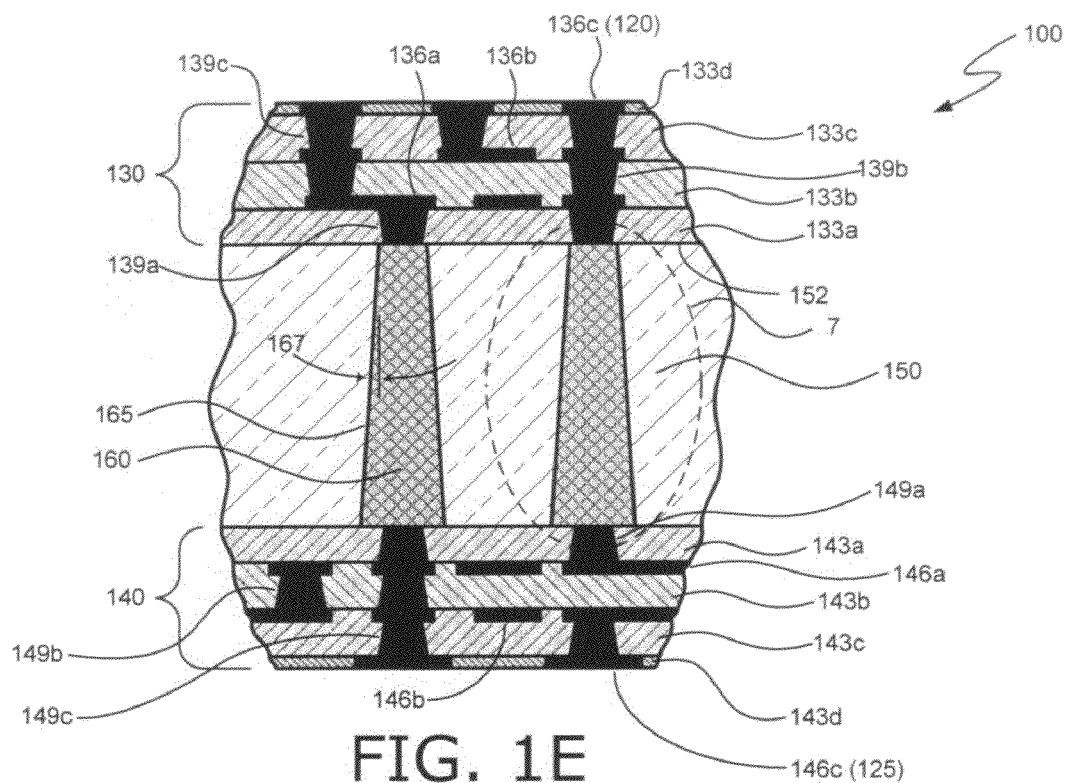
FIG. 1E is a schematic diagram showing a portion of the cross-sectional elevation of FIG. 1B and illustrating yet another embodiment of a glass core substrate.

Turning now to FIGS. 1A and 1B, illustrated are embodiments of a substrate 100 having a core 150 comprised of a glass. A plan view of the glass core substrate 100 is shown in FIG. 1A, whereas a cross-sectional elevation view of the substrate is shown in FIG. 1B, as taken along line B-B of FIG. 1A. Also, various alternative embodiments of the glass core substrate 100 are shown in each of FIGS. 1C through 1E, and each of FIGS. 1C through 1E shows a portion of the substrate 100, identified generally by reference numeral 5 in FIG. 1B, in an enlarged view.

With reference to FIGS. 1A and 1B, the substrate 100 includes a core 150 comprised of a glass. Substrate 100 includes a first side 102 and an opposing second side 104 generally parallel with the first side 102. A periphery 108 of substrate 100 extends between the first and second sides 102, 104. According to some embodiments, the periphery 108 of the substrate 100 is generally rectangular, and in one embodiment all four sides of the periphery 108 are substantially equal such that the periphery forms a square. However, it should be noted that a substrate having a non-rectangular periphery is within the scope of the disclosed embodiments. In one embodiment, the substrate 100 has a thickness of between 0.2 mm and 1 mm.

The glass core 150 has a first surface 152 and an opposing second surface 154. In one embodiment, the first and second surfaces 152, 154 are generally parallel to each other. A periphery 158 of the glass core 150 extends between the first and second surfaces 152, 154, and in some embodiments the glass core's periphery 158 generally corresponds to the substrate's periphery 108. According to one embodiment, the glass core 150 may have a thickness between 0.1 mm and 0.8 mm. Glass core 150 is, in one embodiment, comprised entirely of glass (other than conductors 160, as described below). In a further embodiment, glass core 150 comprises a single, solid piece of glass (although the core includes holes for conductors 160). In other embodiments, the glass core 150 may comprise multiple pieces or sections of glass that have been joined together.

A number of conductors 160 extend through the glass core 150. Each conductor 160 is disposed in a hole or via 165, and each conductor 160 may extend from the first surface 152 to the second surface 154. In other embodiments, however, one or more of the conductors extends only partially through the core's thickness. According to one embodiment, a conductor 160 comprises a hole or via 165 formed through the glass core 150 that has been filled with an electrically conductive material. In another embodiment, a conductor 160 comprises a hole 165 formed in the glass core during a casting process, and this hole is filled with an electrically conductive material. In a further embodiment, a conductor 160 comprises a metal wire embedded in the glass core 150.

Conductors 160 may comprise any suitable electrically conductive material, including metals, composite materials, and electrically conductive polymers. Suitable metals include copper, tin, silver, gold, nickel, aluminum, and tungsten, as well as alloys of these and/or other metals. Processes that may be utilized to form a hole or via 165 include, for example, imprinting, sand blasting, casting, laser drilling, and etching. Electrically conductive material may be deposited in the holes or vias 165 to form conductors 160 by any suitable process, such as, for example, screen printing techniques, plating techniques (electroplating or electroless plating), chemical vapor deposition (CVD), and physical vapor deposition (PVD).

Disposed on the first side 102 of substrate 100 is a first set of electrically conductive terminals 120 (see FIG. 1A). According to one embodiment, the first set of terminals 120 is arranged in a pattern to mate with a corresponding array of terminals disposed on an integrated circuit (IC) die. An IC die is not shown in FIGS. 1A-1B; however, a die region 110 is depicted in FIG. 1A and the terminals 120 lie within this die region (sometimes referred to as a die shadow region). The terminals 120 may each comprise any suitable type of structure capable of forming an electrical connection with a terminal of the IC die. For example, a terminal 120 may comprise a pad, pillar, or stud bump formed from any suitable metal or combination of metals (e.g., aluminum, copper, nickel, etc.), and a solder bump may be disposed on each terminal 120 (and/or on the terminals of the IC die). In one embodiment, an IC die may be disposed on the substrate 100 in a flip-chip manner, and the terminals on the die coupled with the terminals 120 on the substrate 100 by a solder reflow process. According to another embodiment, an IC die may be coupled to the substrate 100 by a layer of adhesive, and terminals on the die electrically coupled to corresponding terminals on the substrate by a wirebond process (in this embodiment, the terminals 120 would lie outside the die region 110).

Disposed on the second side 104 of substrate 100 is a second set of electrically conductive terminals 125 (only a portion being shown in FIG. 1A for clarity and ease of illustration). According to one embodiment, the second set of terminals 125 is arranged in a pattern to mate with a corresponding array of terminals disposed on a next level component, such as a mainboard, a motherboard, or other circuit board (not shown in the figures). The terminals 125 may each comprise any suitable type of structure capable of forming an electrical connection with a terminal of the next-level component. By way of example, a terminal 125 may comprise a pad, land, solder bump or other metal bump, or a pin. The next-level component may include a socket (and retention mechanism) to receive the substrate 100 and terminals 125, such as a Land Grid Array (LGA) socket or a Pin Grid Array (PGA) socket. Alternatively, the terminals 125 may be coupled with terminals on the next level component by a solder reflow process.

Disposed on the first surface 152 of glass core 150 is a first build-up structure 130, and disposed on the core's second surface 154 is a second build-up structure 140. The first build-up structure comprises one or more alternating layers of a dielectric material and a metal, and the terminals 120 are disposed on the first build-up structure 130 (the first substrate side 102 generally corresponding to an outer surface of the first build-up structure 130). At least one of the conductors 160 in glass core 150 is electrically coupled with at least one metal layer of the first build-up structure 130, and in one embodiment a metal layer of the first build-up structure nearest the glass core 150 is coupled with at least one conductor 160. Similarly, the second build-up structure 140 comprises one or more alternating layers of a dielectric material and a metal, and the terminals 125 are disposed on the second build-up structure 140 (the second substrate side 104 generally corresponding to an outer surface of the second build-up structure 140). At least one of the conductors 160 in glass core 150 is electrically coupled with at least one metal layer of the second build-up structure 140, and in one embodiment a metal layer of the second build-up structure nearest the glass core 150 is coupled with at least one conductor 160. The first and second build-up structures 130, 140 route power, as well as input/output (I/O) signals, between the first and second sets of terminals 120, 125 (and, hence, facilitate the delivery of power and signaling between an IC die mounted on substrate 100 and a next-level component). Build-up structures 130, 140 are described in greater detail below.

Referring to FIG. 1C, an embodiment of the glass core substrate 100 is illustrated in greater detail. As previously described, the substrate includes a glass core 150 having conductors 160 extending between first and second surfaces 152, 154, respectively, of the core. Each of the conductors 160 may be disposed in a hole or via 165 extending through the glass core 150. A first build-up structure 130 is disposed on the first side 152 of the core 150, and a second build-up structure 140 is disposed on the core's opposing second side 154.

According to one embodiment, first build-up structure 130 comprises a number of dielectric material layers 133a, 133b, 133c, 133d, and a number of metal layers 136a, 136b, 136c. Dielectric layers 133a-d may comprise any suitable dielectric material (e.g., polymer materials, etc.) and may be formed by any suitable technique (e.g., by deposition, lamination, etc.). Metal layers 136a-c may comprise any suitable electrically conductive metal (e.g., copper, aluminum, silver, etc.), and may be deposited by any suitable technique (e.g., plating processes, such as electroplating and electroless plating). Further, the metal layers 136a-c may each be patterned to form any suitable number and configuration of traces, power planes, ground planes, and other conductors to facilitate the routing of power and I/O signals.

One of the dielectric layers 133a-d is disposed between any two adjacent metal layers 136a-c (e.g., metal layers 136a and 136b are separated by dielectric layer 133b, and so on), and dielectric layer 133a lies adjacent the glass core 150 and separates the metal layer 136a from the core. According to one embodiment, the dielectric layer 133a lies directly adjacent the glass core's first surface 152. Vias 139a, 139b, 139c—which are plated or filled with metal—extend through the dielectric layers 133a, 133b, 133c, respectively, and interconnect adjacent metal layers (e.g., vias 139b interconnect metal layers 136a and 136b, and so on). Further, the metal layer 136a nearest the glass core 150 is coupled with one or more of the conductors 160 by vias 139a disposed in dielectric layer 133a. In one embodiment, the first surface 152 of glass core 150 may include a surface treatment or coating to increase adhesion with the dielectric material of the build-up structure 130. Also, in some embodiments, the outermost dielectric layer 133d may comprise a resist layer and/or a passivation layer. Also, according to one embodiment, terminals 120 are formed by, or formed on, the outermost metal layer 136c.

In one embodiment, second build-up structure 140 comprises a number of dielectric material layers 143a, 143b, 143c, 143d, and a number of metal layers 146a, 146b, 146c. Dielectric layers 143a-d may comprise any suitable dielectric material (e.g., polymer materials, etc.) and may be formed by any suitable technique (e.g., by deposition, lamination, etc.). Metal layers 146a-c may comprise any suitable electrically conductive metal (e.g., copper, aluminum, silver, etc.), and may be deposited by any suitable technique (e.g., plating processes, such as electroplating and electroless plating). Further, the metal layers 146a-c may each be patterned to form any suitable number and configuration of traces, power planes, ground planes, and other conductors to facilitate the routing of power and I/O signals.

One of the dielectric layers 143a-d is disposed between any two adjacent metal layers 146a-c (e.g., metal layers 146a and 146b are separated by dielectric layer 143b, and so on), and dielectric layer 143a lies adjacent the glass core 150 and separates the metal layer 146a from the core. According to one embodiment, the dielectric layer 143a lies directly adjacent the glass core's second surface 154. Vias 149a, 149b, 149c—which are plated or filled with metal—extend through the dielectric layers 143a, 143b, 143c, respectively, and interconnect adjacent metal layers (e.g., vias 149b interconnect metal layers 146a and 146b, and so on). Further, the metal layer 146a nearest the glass core 150 is coupled with one or more of the conductors 160 by vias 149a disposed in dielectric layer 143a. In one embodiment, the second surface 154 of glass core 150 may include a surface treatment or coating to increase adhesion with the dielectric material of the build-up structure 140. Also, in some embodiments, the outermost dielectric layer 143d may comprise a resist layer and/or a passivation layer. In addition, in one embodiment, terminals 125 are formed by, or formed on, the outermost metal layer 146c.

In the embodiment of FIG. 1C (as well as the embodiments shown in each of FIGS. 1D and 1E), the first and second build-up structures have the same number of dielectric and metal layers and, further, have generally equivalent thicknesses. However, the disclosed embodiments are not so limited, and in other embodiments the first and second build-up structures may have differing thicknesses and/or differing numbers of dielectric and metal layers. According to another embodiment, a build-up structure is disposed on only one side of the glass core 150. Also, in some embodiments, the first and second build-up structures are constructed from the same dielectric material and metal. In other embodiments, however, the first and second build-up structures may have differing materials.

In the embodiment of FIG. 1C, dielectric layers 133a and 143a are positioned adjacent the glass core 150, and the metal layers nearest the core (i.e., metal layers 136a and 146a) are separated from the core by these dielectric layers. In an alternative embodiment, as illustrated in FIG. 1D, a metal layer may lie adjacent the glass core 150. The incorporation of a metal layer adjacent one or both sides of the glass core 150 is sometimes referred to as "core layer routing."

Referring to FIG. 1D, the embodiment of substrate 100 is generally similar to that shown in FIG. 1C (and like features are identified by the same reference numerals). However, in the embodiment of FIG. 1D, the first build-up structure 130 includes a metal layer 136x adjacent the glass core 150, and according to one embodiment the metal layer 136x is directly adjacent the glass core's first surface 152. Dielectric layer 133a overlies the metal layer 136x (and exposed portions of the glass core), this metal layer 136x now being the metal layer nearest the core, and at least one of the conductors 160 is coupled with metal layer 136x. Further, in another embodiment, the first surface 152 of glass core 150 may include a surface treatment or coating to increase adhesion with the metal layer 136x (and perhaps with portions of dielectric layer 133a).

Similar to first build-up structure 130, the second build-up structure 140 of FIG. 1D includes a metal layer 146x adjacent the glass core 150, and in one embodiment the metal layer 146x is directly adjacent the glass core's second surface 154. Dielectric layer 143a overlies the metal layer 146x (and exposed portions of the glass core), this metal layer 146x now being the metal layer nearest the core, and at least one of the conductors 160 is coupled with metal layer 146x. In addition, in another embodiment, the second surface 154 of glass core 150 may include a surface treatment or coating to increase adhesion with the metal layer 146x (and perhaps with portions of dielectric layer 143a). In some embodiments, only one of the glass core's surfaces 152, 154 has an adjacent metal layer (e.g., either one of metal layers 136x, 146x in the first and second build-up structures 130, 140, respectively, may be omitted).

With reference now to FIG. 1E, a further embodiment of glass core substrate 100 is illustrated. The embodiment of substrate 100 show in FIG. 1E is generally similar to that shown in FIG. 1C (and like features are identified by the same reference numerals). However, in the embodiment of FIG. 1E, the hole or via 165 in which each conductor 160 is disposed has a wall that is tapered. In one embodiment, the tapered wall of hole or via 165 has an angle 167 relative to a centerline of the hole of between 0 and 30 degrees. The tapered wall of a hole 165 may be the result of the process used to form the hole through the glass core 150. As noted above, processes that may be utilized to form a hole or via 165 include, for example, imprinting, sand blasting, casting, laser drilling, and etching. Depending upon the processing conditions, any one of the aforementioned techniques may form a hole 165 having a tapered wall.

Figure 1F:
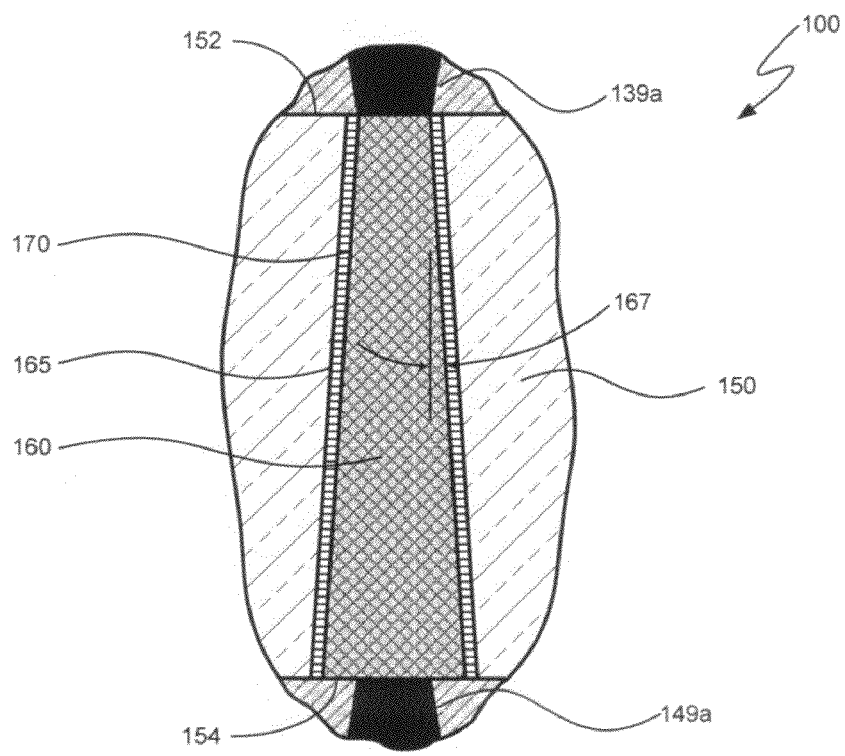
FIG. 1F is a schematic diagram showing a portion of FIG. 1E and illustrating yet a further embodiment of a glass core substrate.

Turning next to FIG. 1F, a further embodiment of the glass core substrate 100 is illustrated. A portion of the substrate 100, as denoted generally by reference numeral 7 in FIG. 1E, is shown in FIG. 1F in an enlarged view (with like features being identified by the same reference numeral). In the embodiment of FIG. 1F, a wetting layer (or adhesion layer) 170 has been disposed over the wall 165 of hole 160. The function of wetting layer 170 is to increase adhesion between the electrically conductive material 160 and the glass material of core 150, and the wetting layer 170 may comprise any suitable material capable of increasing adhesion between these two materials. In one embodiment, the wetting layer 170 comprises a metal, such as, for example, titanium, chromium, nickel, and vanadium, as well as alloys of these and/or other metals. Also, the wetting layer 170 may be deposited or formed using any suitable process, such as a plating technique (electroplating or electroless plating), CVD, or PVD.

Figure 2:
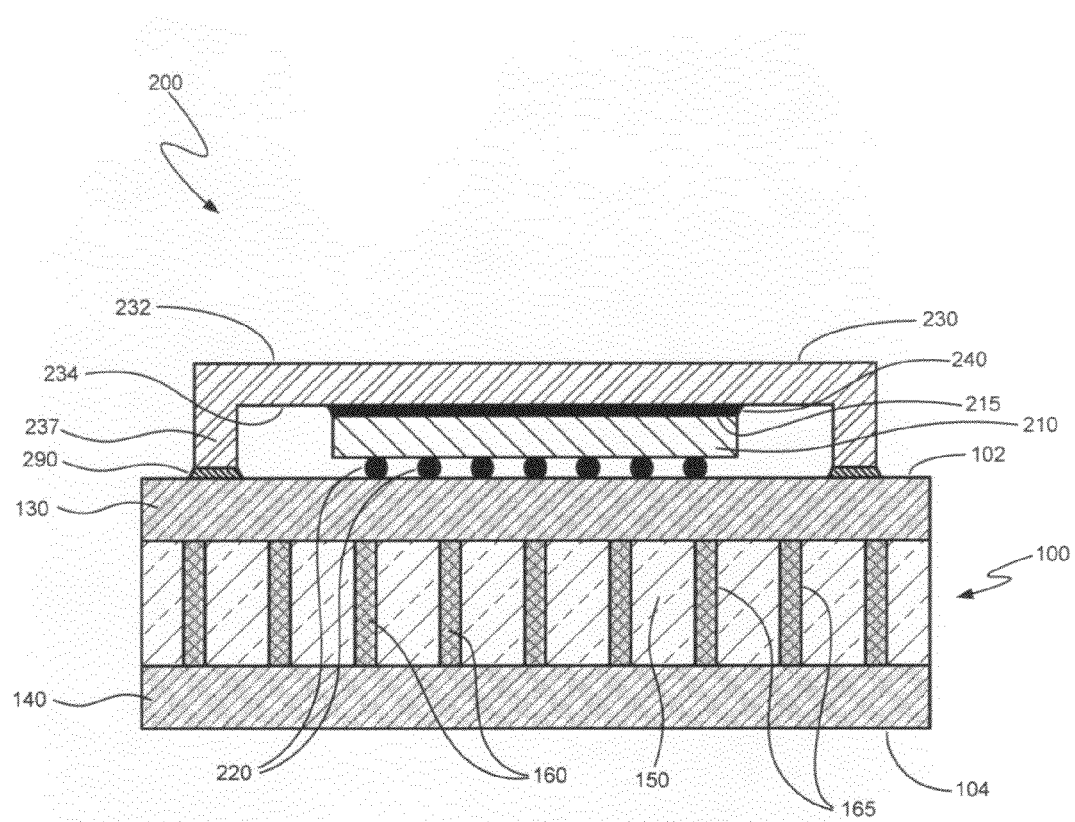
FIG. 2 is a schematic diagram showing a cross-sectional elevation view of an integrated circuit assembly including an embodiment of a glass core substrate.

Illustrated in FIG. 2 is an embodiment of an assembly 200 including a glass core substrate 100. With reference to FIG. 2, the assembly 200 includes substrate 100 having glass core 150, as well as a first side 102 and an opposing second side 104. Disposed on the substrate's first side 102 is an integrated circuit (IC) die 210. The IC die 210 is electrically (and mechanically) coupled with the substrate 100 by a number of interconnects 220. Terminals 125 (e.g., lands, pins, solder bumps, etc.) on the substrates second side 104 (see FIG. 1A) may be used to form electrical connections with a next-level component, such as a motherboard, mainboard, or other circuit board. A heat spreader or lid 230—having a first surface 232 and an opposing second surface 234 that faces a back surface 215 of the die—is disposed over the die 210 and thermally coupled with (and perhaps mechanically coupled with) the die's back surface 215 by a layer of thermal interface material 240. An adhesive or sealant 290 may be used to secure the heat spreader 230 to the first surface 102 of glass core substrate 100. Although not shown in FIG. 2, in a further embodiment a heat sink (or other cooling device) may be thermally coupled with the heat spreader 230, and another layer of a thermal interface material may be disposed between the heat spreader's first surface 232 and the heat sink (or other device).

IC die 210 may comprise any type of semiconductor device. In one embodiment, the IC die 210 comprises a processing system or device. For example, IC die 210 may comprise a microprocessor or a graphics processor. The IC die 210 can perform instructions from any number of processor architectures having any number of instruction formats. In one embodiment, an instruction is an "x86" instruction, as used by Intel Corporation. However, in other embodiments, the processor may perform instructions from other architectures or from other processor designers. In another embodiment, the IC die 210 comprises a memory device. According to a further embodiment, the IC die 210 comprises a system-on-chip (SoC). In yet another embodiment, the IC die 210 may include digital circuitry, analog circuitry, or a combination of both analog and digital circuitry.

Interconnects 220 are formed by coupling terminals 120 on the substrate first surface 102 (see FIG. 1A) with terminals on the IC die 210 by, for example, a solder reflow process. As previously described, the substrate terminals 120 may each comprise a pad, pillar, or stud bump formed from any suitable metal or combination of metals (e.g., copper, nickel, aluminum, etc.), and the die terminals may also comprise a pad, pillar, or stud bump formed from any suitable metal or combination of metals. Solder (e.g., in the form of balls or bumps) may be disposed on the substrate and/or die terminals, and these terminals may then be joined using a solder reflow process. It should be understood that the aforementioned interconnects are but one example of the type of interconnects that can be formed between substrate 100 and IC die 210 and, further, that any other suitable type of interconnect may be utilized. In addition, a layer of underfill material (not shown in FIG. 2) may be disposed around the interconnects 220 and between the IC die 210 and the substrate's first side 102.

Heat spreader 230 may be comprised of any suitable thermally conductive materials and may have any suitable shape or structure. According to one embodiment, the heat spreader 230 comprises a lid having a side wall (or walls) 237 extending towards the substrate's first side 102, with this wall (or walls) being secured to the substrate surface 102 by the adhesive 290. The above-describe lid is sometimes referred to as an integrated heat spreader, or IHS. Materials that may be used to construct the heat spreader 230 include metals (e.g., copper and alloys thereof), thermally conductive composites, and thermally conductive polymers.

In the embodiment illustrated in FIG. 2, the assembly 200 includes a single IC die 210. However, in other embodiments, the assembly 200 may comprise a multi-chip package. For example, one or more other integrated circuit die (e.g., a memory device, a voltage regulator, etc.) may be disposed on the substrate 100. In addition, passive devices, such as capacitors and inductors, may be disposed on the glass core substrate 100 or, alternatively, integrated into the build-Up structures 130, 140 of the substrate. By way of example, an array capacitor or a thin-film capacitor may be integrated into the build-up structures 130, 140 of the substrate 100. In another embodiment, a wireless component, such as an antenna or an RF shield, may be disposed on glass core substrate 100 or integrated into the build-up structures 130, 140 of this substrate. These additional devices, whether IC die, passive devices, or other components, may be disposed on either side 102, 104 of the glass core substrate 100.

The assembly 200 may form part of any type of computing device. According to one embodiment, the assembly 200 may form part of a server or desktop computer. In another embodiment, the assembly 200 forms part of a lap-top computer or similar mobile computing device (e.g., a net-top computer). In a further embodiment, the assembly 200 comprises part of a hand-held computing device, such as a cell phone, a smart phone, or a mobile internet device (MID). In yet another embodiment, the assembly 200 forms part of an embedded computing device.

Figure 3:
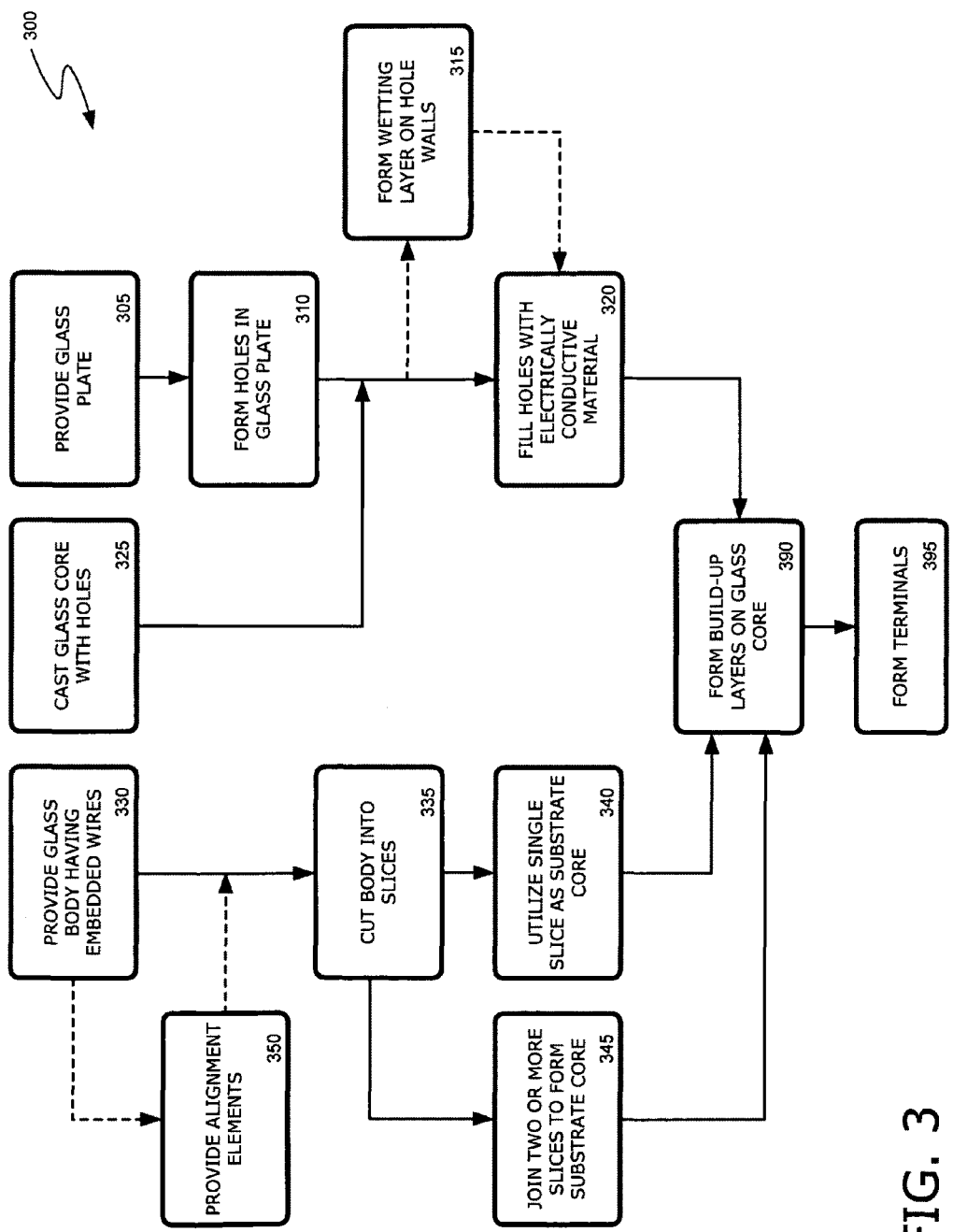
FIG. 3 is a block diagram illustrating embodiments of various methods of forming a glass core substrate.

Illustrated in FIG. 3 are embodiments of various methods of making a glass core substrate. These various methods and embodiments thereof are further illustrated in FIGS. 4A-4F, FIGS. 5A-5C, FIGS. 6A-6C, FIGS. 7A-7C, FIGS. 8A-8C, FIGS. 9A-9C, FIGS. 10A-10C, FIGS. 11A-11D, FIG. 12, FIG. 13, and FIG. 14, and reference should be made to these figures as called out in the text below.

Figure 4A:
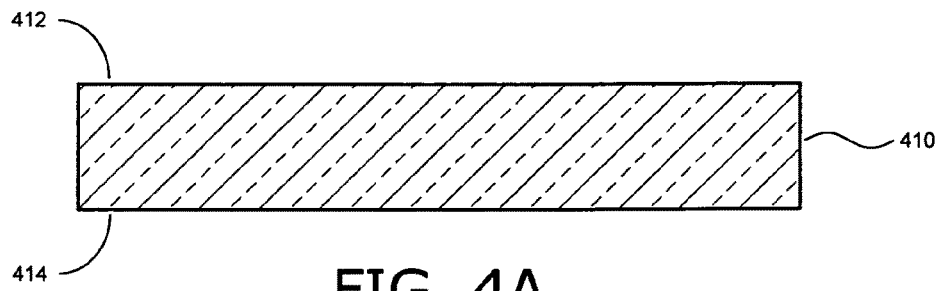
FIGS. 4A-4F are schematic diagrams illustrating embodiments of a method of forming holes in a glass core.
Figure 4B:
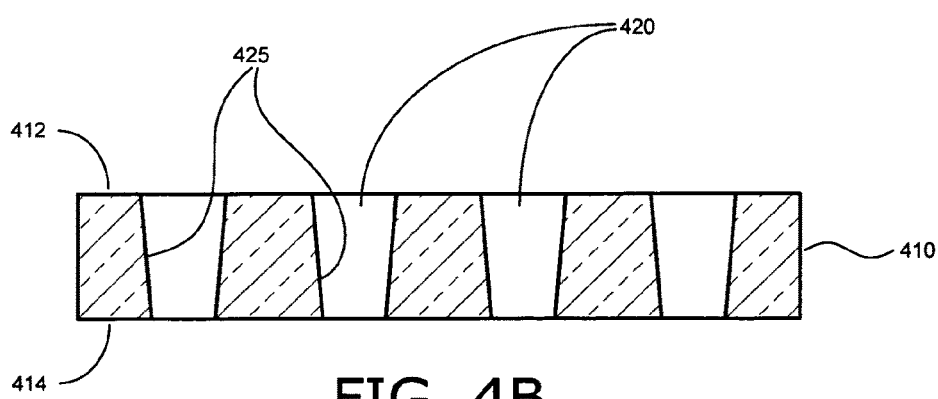

Referring to block 305 in FIG. 3, in one embodiment a glass plate is provided. This is illustrated in FIG. 4A, where a glass plate 410 is shown. The glass plate includes a first surface 412 and an opposing second surface 414 that is generally parallel with first surface 412. Glass plate 410 may comprise any suitable type of glass and have any suitable thickness (see discussion above), depending upon the application and/or desired characteristics. According to one embodiment, the glass plate 410 is of a size and configuration to enable formation of a single substrate. In a further embodiment, the glass plate 410 is of a size and configuration to enable the formation of two or more substrates (e.g., the glass plate 410 comprises a panel from which two or more substrates will be cut). Plate 410 will have a softening temperature associated with the glass material comprising this plate.

As set forth in block 310 of FIG. 3, holes or vias are formed in the glass plate. This is further illustrated in FIG. 4B, where holes 420 have been formed in glass plate 410, each hole extending from the first surface 412 to the plate's second surface 414. In other embodiments, one or more of the holes or vias 420 may not extend entirely through the thickness of the glass plate 410. Various methods may be implemented to form the holes 420. In one embodiment, the holes are formed by a planar imprinting technique (see FIGS. 5A-5C). In another embodiment, the holes are formed by a roller imprinting technique (see FIGS. 6A-6B). In a further embodiment, the holes are formed by a sand blasting (or power blasting or particle blasting) technique (see FIGS. 7A-7C). Each of these embodiments for forming holes 420 will now be described in greater detail. It should be understood, however, that the disclosed embodiments are not limited to the hole formation techniques described in FIGS. 5A through 7C and, further, that other methods may be employed to form holes in a glass plate (e.g., laser drilling, etching, etc.).

Figure 5A:
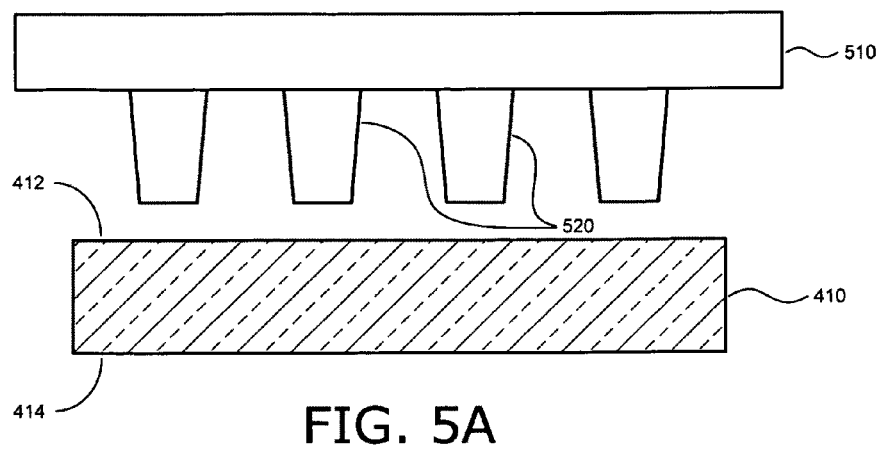
FIGS. 5A-5C are schematic diagrams illustrating embodiments of an alternative method of forming holes in a glass core.

Turning to FIG. 5A, an imprinting tool 510 is shown in conjunction with glass plate 410. A number of protrusions 520 extend from imprinting tool 510, and each of these protrusions is sized, oriented, and located to create one of the holes or vias 420 in glass plate 410. The imprinting tool 510 may comprise any suitable material capable of forming the holes in the glass material of plate 410 and withstanding the associated processing temperatures. In one embodiment, surfaces of the imprinting tool 510 and protrusions 520 may include a coating or surface treatment to minimize adhesion with the glass material (e.g., to prevent sticking between the tool and glass).

Figure 5B:
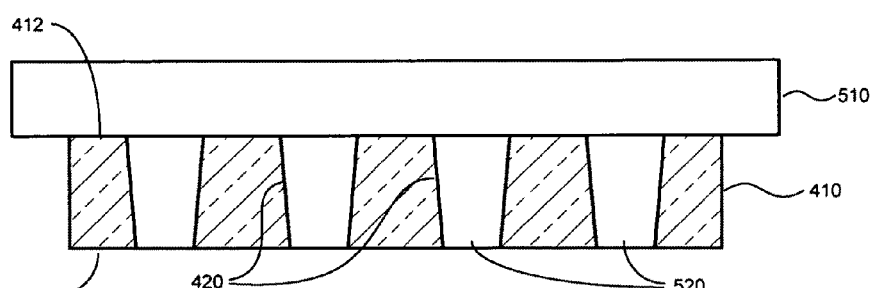

Referring to FIG. 5B, the glass plate 410 is raised to the softening temperature, and the protrusions 520 of imprinting tool 510 are plunged into the glass plate 410. Protrusions 520 will form holes 420 in the softened glass plate 410. The time required to heat glass plate 410 to the softening temperature, as well as the amount of time the plate is maintained at this temperature while engaged with the imprinting tool 510, are dependent upon, for example, the glass material comprising plate 410, the desired characteristics of the final glass core, and the processing equipment being utilized.

Figure 5C:
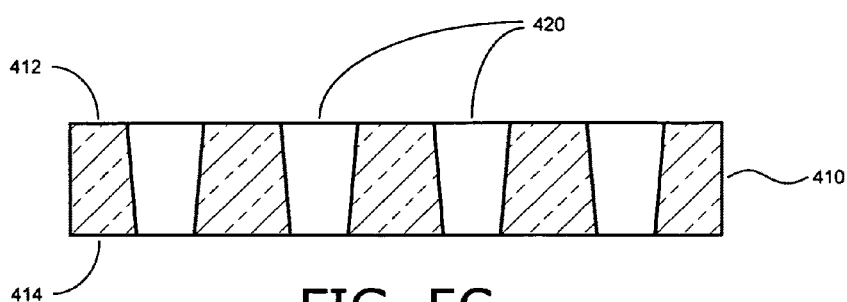

Referring next to FIG. 5C, the imprinting tool 510 has been removed and the plate 410 cooled to return the glass material to a solid state. Holes 420 remain in the glass plate 410 at locations corresponding to protrusions 520 on imprinting tool 510. In one embodiment, after imprinting, an annealing process may be performed to relieve internal stresses within glass plate 410.

Figure 6A:
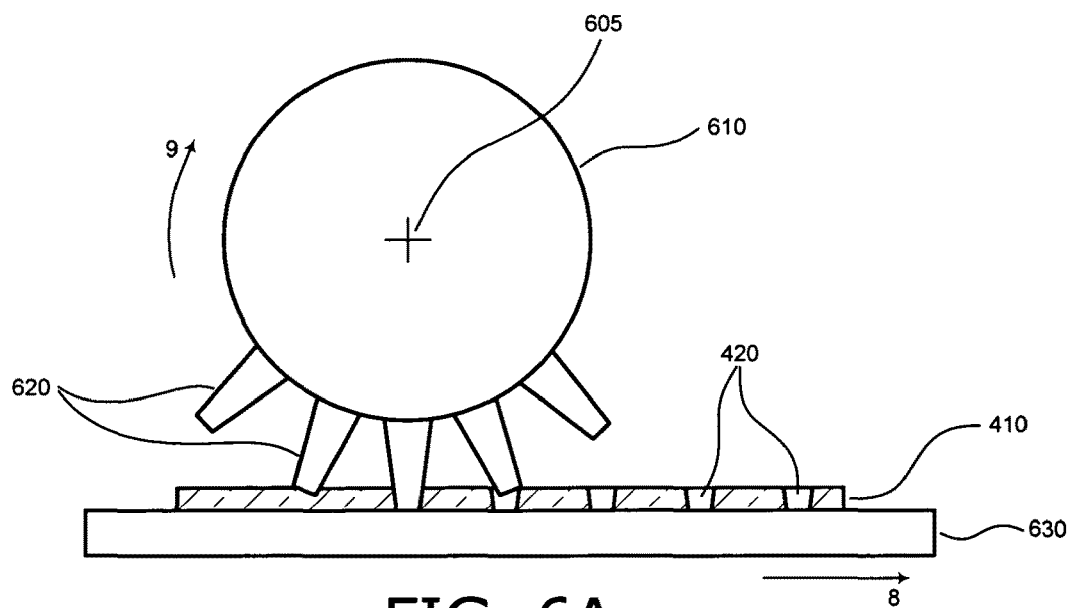
FIGS. 6A-6B are schematic diagrams illustrating embodiments of a further alternative method of forming holes in a glass core.
Figure 6B:
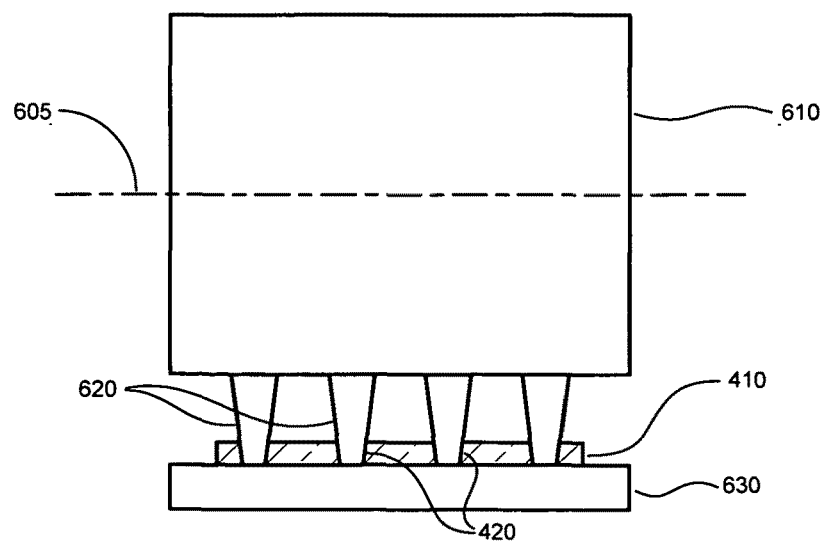

Turning now to FIGS. 6A and 6B, a roller imprinting tool 610 is shown in conjunction with glass plate 410. A number of protrusions 620 extend from the roller imprinting tool 610, and each of these protrusions is sized, oriented, and located to create one of the holes or vias 420 in glass plate 410. Note that, for clarity and ease of illustration, only a portion of the protrusions 620 on tool 610 are shown in FIGS. 6A-6B (e.g., protrusions 620 may extend about the full circumference of tool 610). Roller imprinting tool 610 may rotate about an axis 605, and the glass plate 410 may rest on a support plate or carrier 630 that is capable of moving relative to tool 610 (or, alternatively, tool 610 is capable of moving relative to support plate 630). The imprinting tool 610 may comprise any suitable materials capable of forming the holes in the glass material of plate 410 and withstanding the associated processing temperatures. In one embodiment, surfaces of the imprinting tool 610 and protrusions 620 may include a coating or surface treatment to minimize adhesion with the glass material.

The glass plate 410 is raised to the softening temperature, and the protrusions 620 of imprinting tool 610 are engaged with glass plate 410. The roller imprinting tool 610 is engaged with glass plate 410 by moving the glass plate relative to tool 610 (see arrow 8) while rotating the tool 610 about axis 605 (see arrow 9). Protrusions 620 will form holes 420 in the softened glass plate 410. The time required to heat glass plate 410 to the softening temperature, as well as the amount of time the plate is maintained at this temperature while engaged with the imprinting tool 610, are dependent upon, for example, the glass material comprising plate 410, the desired characteristics of the final glass core, and the processing equipment being utilized. After the glass plate 410 has engaged with the roller imprinting tool 610, the plate 410 is cooled to return the glass material to a solid state. Holes 420 remain in the glass plate at locations corresponding to protrusions 620 on imprinting tool 610. In one embodiment, after imprinting, an annealing process may be performed to relieve internal stresses within glass plate 410.

Figure 7A:
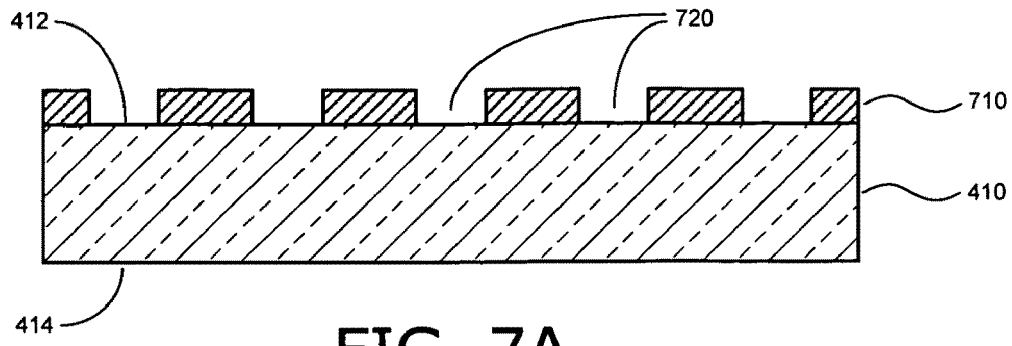
FIGS. 7A-7C are schematic diagrams illustrating embodiments of yet another alternative method of forming holes in a glass core.

With reference to FIG. 7A, a layer of resist material 710 has been disposed on the first surface 412 of glass plate 410, and this resist layer 710 has been patterned to form openings 720. A sand blasting process will be performed on the glass plate 410, and the resist layer 710 may comprise any material capable of withstanding the sand blasting process (e.g., the resist layer is substantially impervious to the sand blasting process or, alternatively, the resist layer is removed by the sand blasting process at a lower rate then the glass material is removed). The resist layer material should also be amendable to a patterning technique (e.g., photolithography) to enable formation of openings 720.

Figure 7B:
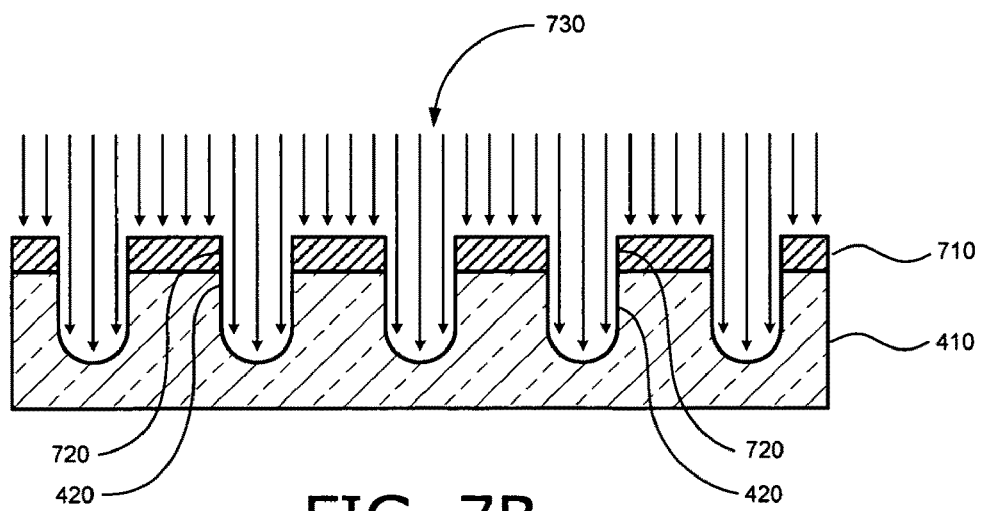
Figure 7C:
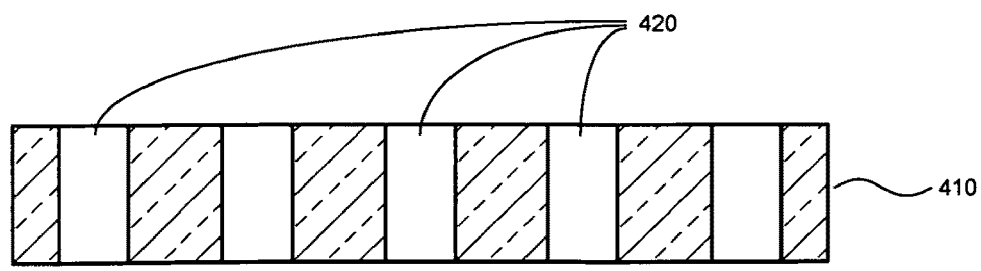

Referring to FIG. 7B, a sand blasting process (which may also be referred to as powder blasting or particulate blasting) is performed on the glass plate 410 having patterned resist layer 710. Any suitable sand blasting technique and tools may be employed using any suitable sand or particulate 730. The particulate used will depend upon the tools employed, the process characteristics, and the glass material comprising plate 410. The moving particulates 730 will remove those portions of the glass plate exposed by openings 720 in resist layer 710. The moving particulates 730 may also attack the resist material 720, but at a lower rate than the glass substrate 410, allowing for the formation of holes 420 at only locations of openings 720. Sand blasting may continue until the holes 420 extend through the glass plate 410 from first surface 412 to second surface 414 (although it is within the scope of the disclosed embodiments that one or more of the holes 420 does not extend entirely through the glass plate 410). After sand blasting is complete, as shown in FIG. 7C, the resist material 720 is removed, and holes 420 have been formed in glass plate 410.

Figure 4C:
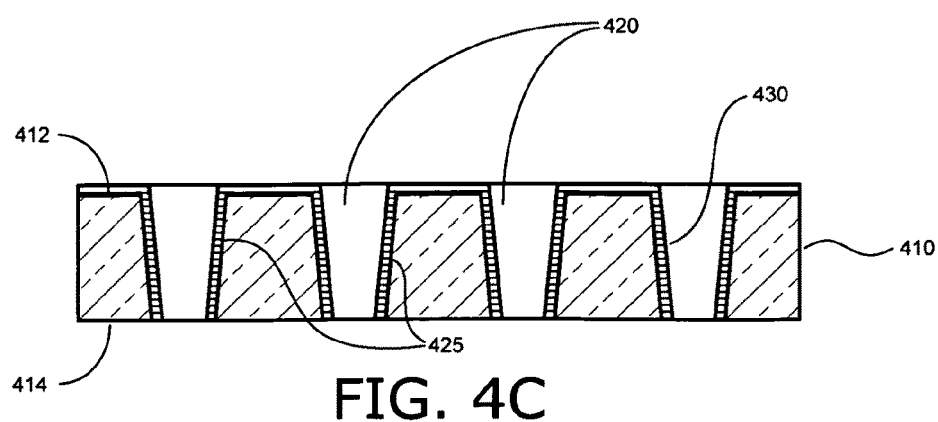
Figure 4D:
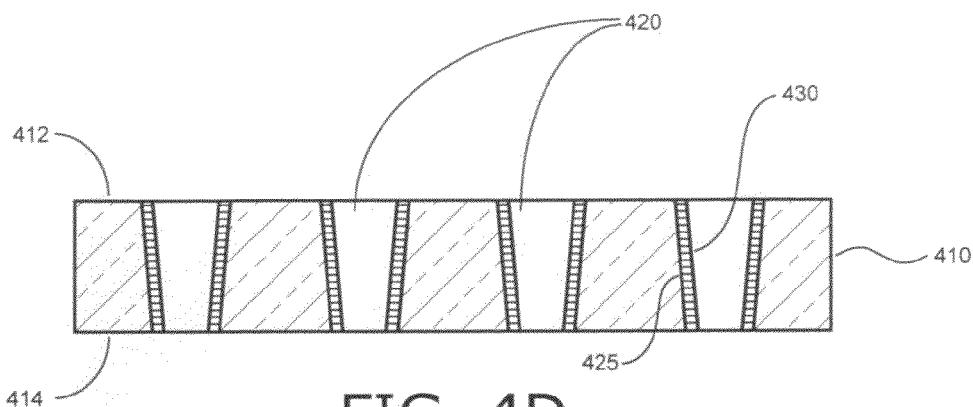

Returning now to FIG. 3, and block 315 in particular, in one embodiment a wetting or adhesion layer may be formed over walls of the vias. This is illustrated in FIG. 4C, where a layer of wetting material 430 has been disposed over the walls 425 of holes 420, as well as over the first surface 412 of glass plate 410. Any suitable blanket deposition process may be employed to form wetting layer 430, such as a plating technique (electroplating or electroless plating), CVD, or PVD. The wetting material 430 is then removed from the glass plate's first surface 412, such that the wetting material 430 remains only on the walls 425 of vias 420, as shown in FIG. 4D. The excess wetting material 430 may be removed from the surface 412 by, for example, a grinding process or chemical-mechanical polishing technique.

As set forth above, the function of wetting layer 430 is to increase adhesion between the glass material of plate 410 and an electrically conductive material that is to be deposited in holes 420, and the wetting layer 430 may comprise any suitable material capable of increasing adhesion between these materials. In one embodiment, the wetting layer 430 comprises a metal, such as, for example, titanium, chromium, nickel, or vanadium, as well as alloys of these and/or other metals. However, in other embodiments, a wetting layer is not deposited on the surfaces of the vias 420 in glass plate 410 (i.e., the step corresponding to block 315 may be omitted).

Figure 4E:
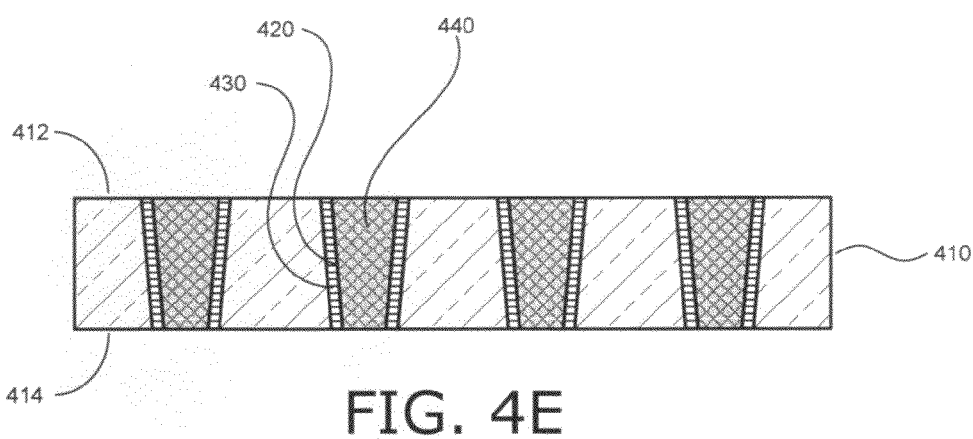

As set forth in block 320, the holes in the glass plate are filled with an electrically conductive material to form conductors extending through the glass plate. This is illustrated in FIG. 4E, wherein an electrically conductive material 440 has been disposed in holes 420. In the embodiment of FIGS. 4A-4F, the conductive material 440 is disposed on the wetting layer 430, but as noted above in other embodiments such a wetting layer may not be present. The electrically conductive material 440 may be deposited in the vias 420 by any suitable process, such as, for example, screen printing techniques, plating techniques (electroplating or electroless plating), CVD, or PVD. The material 440 forming conductors in glass plate 410 may comprise any suitable electrically conductive material, including metals, composite materials, and electrically conductive polymers. Suitable metals include copper, tin, silver, gold, nickel, aluminum, and tungsten, as well as alloys of these and/or other metals. In one embodiment, any of these metals may be deposited in paste or particle form (e.g., where a screen printing technique used), and a sintering process may be performed after paste deposition.

Figure 4F:
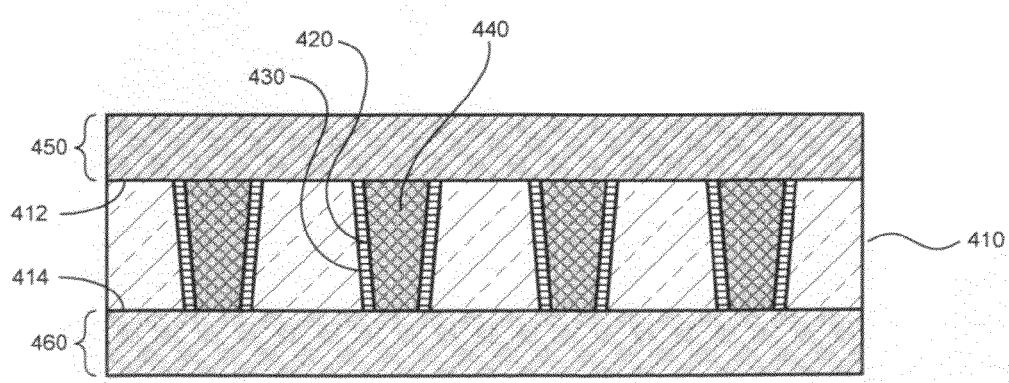

Referring to block 390, one or more build-up layers is disposed on each side of the glass plate (or perhaps only one side) to create build-up structures, as previously described. This is shown in FIG. 4F, where a first build-up structure 450 has been formed on the first surface 412 of glass plate 410, and a second build-up structure 460 has been formed on the glass plate's second surface 414. Each build-up structure 450, 460 may comprise any suitable number of alternating layers of dielectric material and metal (e.g., one or more), and they may be formed by any suitable techniques. The structure and formation of such build-up structures is described in greater detail with reference to FIGS. 1B through 1F and the accompanying text above. In one embodiment, at least one of the conductors 440 is electrically coupled with a metal layer of the first build-up structure that is nearest the glass plate 410, and in a further embodiment at least one of the conductors 440 is electrically coupled with a metal layer of the second build-up structure that is nearest the glass plate.

With reference to block 395, electrically conductive terminals may be formed on the glass plate (terminals are not shown in FIGS. 4A-4F). A first set of terminals may be formed on the first build-up structure 450, and a second set of terminals may be formed on the second build-up structure 460. The structure and formation of such terminals is described in greater detail with reference to FIGS. 1A through 1F and the accompanying text above.

As noted above, in one embodiment, the glass plate 410 includes structures and features corresponding to two or more substrates. In this embodiment, the glass plate 410 with build-up structures 450, 460 may be singulated into these discrete substrates (either before or after formation of the terminals).

Figure 8A:
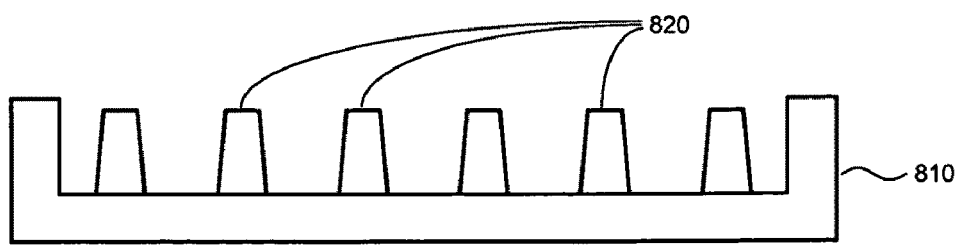
FIGS. 8A-8C are schematic diagrams illustrating embodiments of yet a further alternative method of forming holes in a glass core.
Figure 8B:
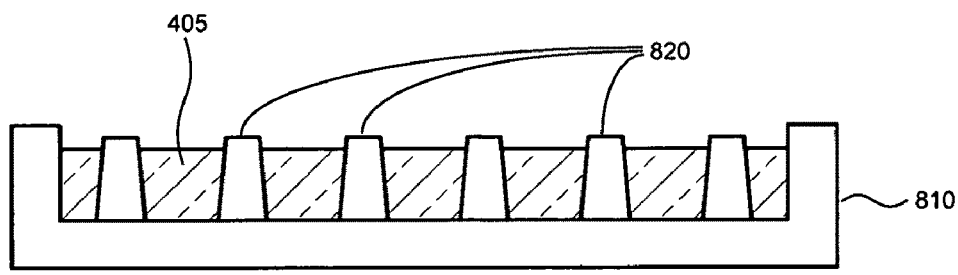
Figure 8C:
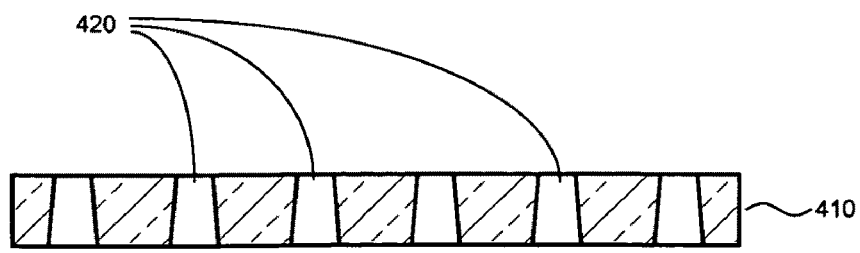

Turning now to block 325 in FIG. 3, in another embodiment, a glass core with holes is formed by a casting process. An embodiment of a casting process is shown in FIGS. 8A-8C. Referring to FIG. 8A, a casting mold 810 includes a number of protrusions 820, each protrusions 820 being sized, oriented, and located to create one of the holes or vias in a molded glass plate. The casting mold 810 may comprise any suitable material capable of withstanding the processing temperatures associated with molten glass. In one embodiment, surfaces of the casting mold 810 and protrusions 820 may include a coating or surface treatment to minimize adhesion with the glass material (e.g., to prevent sticking between the mold and glass).

Referring to FIG. 8B, a glass material 405, which has been heated to the melt temperature for a time sufficient to transform the glass into a molten liquid state, is disposed in the mold 810. The molten glass flows into the mold 810 and around protrusions 820, such that holes will be formed at locations corresponding to protrusions 820. The glass is then cooled to a solid state and then removed from the mold 820, providing a cast glass plate 410 having holes 420, as shown in FIG. 8C. The time and temperature profile employed to both heat and cool the glass will be dependant upon the glass material being used as well as the desired properties of the final glass plate. In one embodiment, after casting, an annealing process may be performed to relieve internal stresses within glass plate 410.

After casting of glass plate 410 having holes 420, a glass core substrate may be fabricated, as described above with respect to blocks 315, 320, 390, and 395. Again, a wetting layer, as shown in block 315, may be omitted in some embodiments.

Referring to block 330 in FIG. 3, in yet a further embodiment, a glass core is formed by providing a glass body having embedded conductive wires. This is further illustrated in FIGS. 9A and 9B, which show a glass body 910 having embedded wires 920. The wires 920 are disposed within holes 930, wherein the holes 930 may be formed during the process of embedding the wires 920 within the glass body 910. Wires 920 may comprise any suitable electrically conductive material (e.g., copper, aluminum, nickel, as well as alloys of these and/or other metals). Glass body 910 may comprise any suitable glass material and may be formed using any suitable process or combination of processes. According to one embodiment, the wires 920 are embedded during the same process in which glass body 910 is formed. For example, the glass body 910 having embedded wires 920 (within holes 930) may be formed using an extrusion process. In one embodiment, where a glass body 910 having embedded wires 920 is utilized for glass core fabrication, via formation and metal fill processes can be omitted.

In one embodiment, the glass body 910 has a generally rectangular parallel-piped shape. Glass body may have a surface 912a and an opposing surface 912b that is generally parallel with surface 912a, a surface 914a and an opposing surface 914b that is generally parallel with surface 914a, and a surface 916a and an opposing surface 916b that is generally parallel with surface 916a. The wires 920 (and holes 930) extend from surface 912a through the glass body 910 to opposing surface 912b, and the wires may be generally parallel with surfaces 914a-b and 916a-b. Although shown as generally circular in cross-section, the wires 920 may have any other suitable shape (e.g., oval, square, hexagonal, etc.). Also, when viewed from the side (see FIG. 9B), the glass body 910 has a rectangular cross-section; however, it should be understood that the disclosed embodiments are not limited to a rectangular or square cross-section (e.g., the glass body 910 may have a circular or oval cross-section, etc.).

Referring to block 335, one or more slices are cut from the glass body. This is illustrated in FIG. 9C, where a cutting tool and/or process 950 is applied to the glass body 910 to cut a slice 940. Slice 940 has a first side 942 and an opposing second side 944 that is generally parallel with first side 942. Also, portions of the embedded wires 920 remain in the slice 940 and extend from the first side 942 to the second side 944 (for clarity, the hidden lines associated with the extension of wires 920 through the thickness of slice 940 are shown for only a portion of the wires in FIG. 9C). Any suitable cutting tool or method may be employed to cut a slice 940 from glass body 910, such as laser cutting or mechanical sawing. In one embodiment, after cutting, an annealing process may be performed to relieve internal stresses within glass slice 410.

The slice 940 having embedded wire portions 920 may be used to construct a glass core for a substrate, with the wire portions 920 providing conductors through the glass core's thickness. Utilizing a structure having embedded wires as conductors eliminates the processes of via formation (e.g., see block 310) and via metal fill (e.g., see block 320 and 315). In one embodiment, as set forth in block 340 of FIG. 3, a single slice 940 may be used as the glass core for a substrate. One or more build-up layers may be formed on the first and second side 942, 944 of the core 940 (or perhaps only one side o the core), and terminals may also be formed on the build-up structures (see blocks 390 and 395, as well as the accompanying text above).

In another embodiment, as set forth in block 345, two or more slices cut from the glass body may be joined together to form a glass core. This is further illustrated in FIGS. 10A and 10B, which show two slices 940a and 940b cut from glass body 910, each having embedded wires 920 extending through their respective thicknesses (as before, the hidden lines associated with wires 920 are shown for only a portion of the wires for clarity). The two glass slices 940a, 940b are joined together along the two facing edges 914a, 914b of slices 940a, 940b, respectively, to form a glass core 1002 having conductors 920. Any suitable process may be employed to join or fuse the two slices 940a, 940b together. For example, the slices 940a-b may be brought together under elevated temperature (e.g., at or above the softening temperature) and/or pressure to fuse the two glass pieces together. Alternatively, the slices 940a-b may be joined using an adhesive.

Figure 10A:
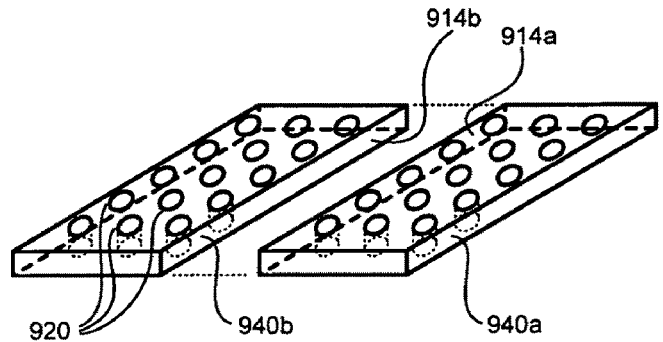
FIGS. 10A-10C are schematic diagrams illustrating embodiments of the joining of two or more slices from the glass body of FIGS. 9A-9B.
Figure 10B:
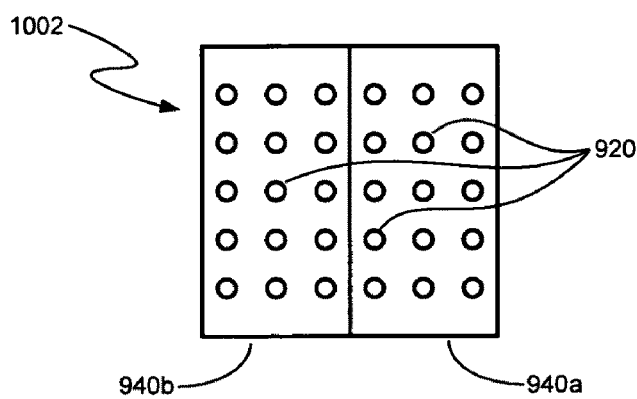
Figure 10C:
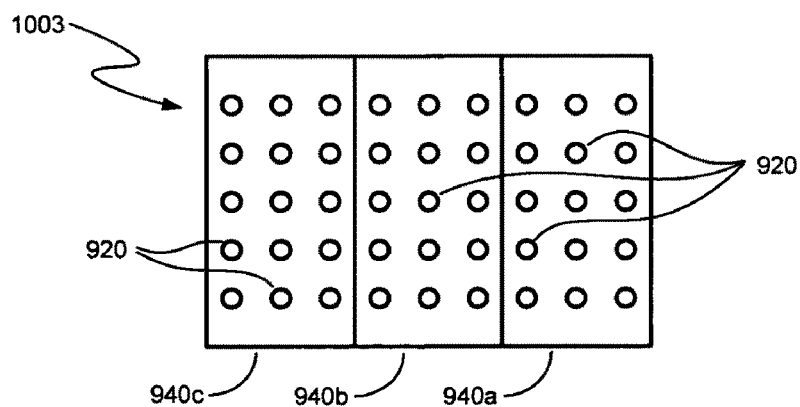

In FIGS. 10A and 10B, two slices 940a-b cut from glass body 910 were joined together to create a glass core. However, it should be understood that any suitable number of slices can be joined together to create a glass core having any desired size. By way of example, as shown in FIG. 10C, three slices 940c, 940d, 940e may be joined together to form a glass core 1003. Embedded wires 920 extend through the thickness of the glass core 1003.

Irrespective of the number of glass slices being joined, after the slices have been fused together into a glass core 1002 or 1003, the substrate fabrication process may continue as previously described. One or more build-up layers may be formed on the opposing sides of the core 1002 or 1003 (or perhaps only one side thereof), and terminals may also be formed on the build-up structures (see blocks 390 and 395, as well as the accompanying text above).

Referring to block 350, in another embodiment, alignment elements are provided. This is illustrated in FIGS. 11A and 11B, where mating alignment elements 1150, 1160 have been disposed on glass body 910 (like features between FIGS. 9A-9C and FIGS. 11A-11D retaining the same numerical designation in FIGS. 11A-11D). Where two or more glass slices are being joined to form a core, the alignment elements 1150, 1160 can be used to align and orient the slices relative to each other during the joining process. The mating alignment elements may comprise any structures or features capable of aligning and/or orienting one glass slice relative to another glass slice, and any suitable number of mating alignment features may be disposed on the glass body 910 (and, hence, any slice cut from the glass body). In the illustrated embodiment, there are two alignment elements 1150, each comprising a wire partially embedded in (or otherwise adhered to) the surface 914b of glass body 910. Further, there are two alignment elements 1160, and each comprises a notch formed in the glass body's opposing surface 914a. Again, however, there may be any suitable number of mating alignment elements (e.g., three or more mating pairs, etc.).

The alignment elements 1150, 1160 may be formed on, or disposed on, the glass body 910 using any suitable technique. According to one embodiment, the alignment elements 1150 are disposed on the glass body 910 during the same process in which wires 920 are embedded, and in a further embodiment the alignment elements 1160 are also formed during the same process that creates glass body 910 (e.g., wires 920 and 1150 may be disposed on glass body 910 during an extrusion process that also results in formation of notches 1160). However, in other embodiments, either of the alignment elements 1150 or 1160 may be disposed on glass body 910 by separate processes (e.g., notches 1160 may be formed after extrusion by a grinding or cutting process, wires 1150 may be disposed on glass body 910 using adhesive, etc.). Also, the alignment elements may comprise any suitable materials capable of withstanding any subsequent processing temperatures. In the illustrated embodiment, the wires 1150 may comprise a metal, such as tungsten, molybdenum, or nickel, as well as alloys of these and/or other metals. According to one embodiment, the wires 1150 comprises the same metal as embedded wires 920. According to another embodiment, the wires 1150 comprise a metal having a CTE approximately the same as the glass material of body 910.

The glass body 910 having alignment elements 1150, 1160 is then cut into slices (see block 335), as previously described. Two or more of these slices can then be joined to form a glass core for a substrate (see block 345). For example, as shown in FIG. 11C, two slices 940a and 940b have been joined to form glass core 1102. During joining of glass slices 940a, 940b, the alignment elements 1150, 1160 engage to align these two pieces relative to one another. By way of further example, as shown in FIG. 11D, three sections 940c, 940d, and 940e have been joined to form glass core 1103. Again, the mating alignment elements 1150, 1160 of the three sections 940c-e engage and align these three pieces relative to each other.

Irrespective of the number of glass slices being joined, after the slices have been fused together into a glass core 1102 or 1103, the substrate fabrication process may continue as previously described. One or more build-up layers may be formed on the opposing sides of the core 1102 or 1103 (or perhaps only one side thereof), and terminals may also be formed on the build-up structures (see blocks 390 and 395, as well as the accompanying text above).

Figure 12:
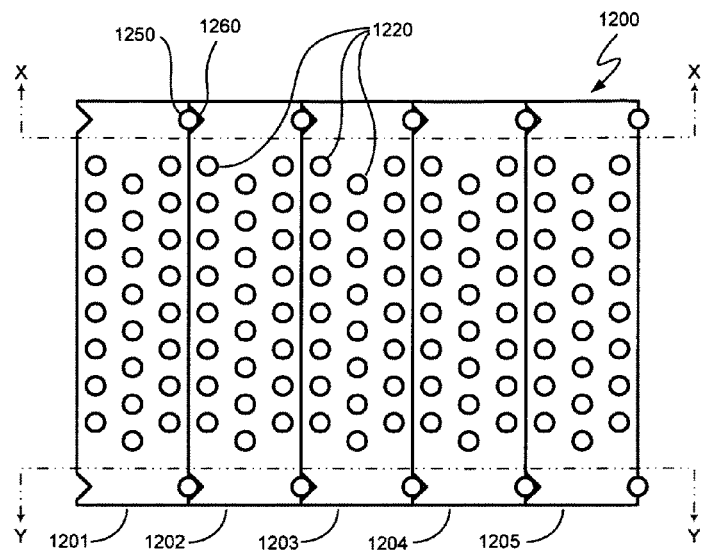
FIG. 12 is a schematic diagram illustrating another embodiment of the joining of sections cut from a glass body having embedded metal wires and alignment elements.

In the embodiments of FIGS. 11A through 11D, the alignment wires 1150 were disposed within the array of conductors 920. According to one embodiment, the alignment wires 1150 may be utilized as conductors through the glass core (e.g., the alignment wires 1150 may serve functions similar to conductors 920). However, in other embodiments, the alignment elements may be located outside the array of conductors, and in yet another embodiment the alignment elements may be removed after joining is complete. The aforementioned embodiments are illustrated in FIG. 12, which shows five glass slices or sections 1201, 1202, 1203, 1204, and 1205 that have been joined together to form a glass core 1200. A number of conductors 1220 extend through each of the glass sections 1201-1205. Each slice of glass 1201-1205 also includes mating alignment elements 1250, 1260, which have been utilized to align the glass sections 1201-1205 during the joining process. The alignment elements 1250, 1260 are positioned outside the array of conductors 1220. In one embodiment, after glass joining has been performed to create core 1200, portions of the glass core including the alignment elements 1250, 1260 may be removed. For example, the glass core 1200 may be cut along lines X-X and Y-Y to remove the alignment features 1250, 1260, and any suitable cutting process may be employed to remove these portions of the core (e.g., laser cutting, sawing, etc.).

Figure 13:
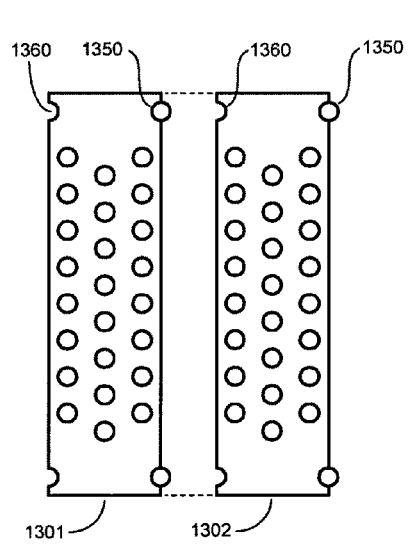
FIG. 13 is a schematic diagram illustrating a further embodiment of the joining of sections cut from a glass body having embedded metal wires and alignment elements.
Figure 14:
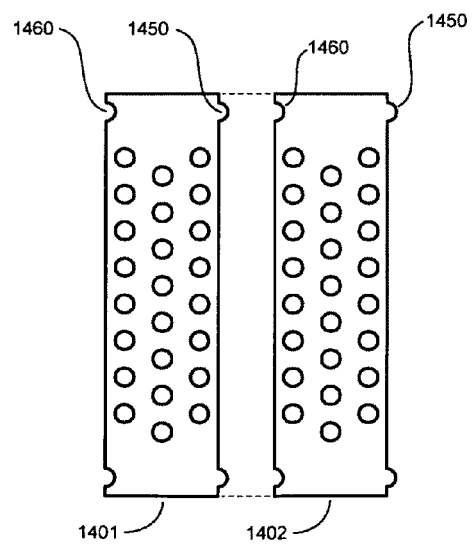
FIG. 14 is a schematic diagram illustrating yet another embodiment of the joining of sections cut from a glass body having embedded metal wires and alignment elements.

In the embodiments previously described, the alignment elements comprise a round wire and a mating triangular-shaped notch. However, it should be understood that the aforementioned alignment elements may have any suitable shape and configuration. For example, as shown in FIG. 13, two glass slices 1301 and 1302 are to be joined together, and each slice includes alignment features 1350 and 1360. Alignment features 1350 comprise a wire, and alignment features 1360 comprise a semi-circular notch sized to receive one of the wires 1350. By way of further example, as shown in FIG. 14, two glass sections 1401 and 1402 are to be joined together, with each slice having alignment elements 1450 and 1460. Alignment features 1460 comprise notches (in this instance, semi-circular in shape), but the alignment elements 1450 comprise protrusions formed directly on the glass sections 1401, 1402 (the protrusion in this example also being semi-circular in shape). In the embodiment of FIG. 14, it is not necessary to attach separate alignment features (e.g., alignment wires), and both mating alignment features 1450, 1460 may be formed during an extrusion process utilized to create the glass body (having embedded wires) from which the slices 1401, 1402 are cut.

At this juncture, it should be noted that the figures are schematic diagrams provided as an aide to understanding the disclosed embodiments, and no unnecessary limitations should be implied from the figures. In some instances, a relatively small number of features may have been illustrated for clarity and ease of illustration. For example, the number of conductors 60 (or 440, 920, 1220) extending through the glass core 150 (or 410, 1002, 1003, 1102, 1103, 1200) shown in the figures may be substantially less than a number of conductors that may, in practice, be disposed in such a glass core. Also, the figures may not be drawn to scale, and in some cases lines (e.g., hidden lines) have been omitted for ease of understanding.

Glass materials may have a CTE of approximately 3.2 ppm, although the CTE value is temperature dependent and will also vary depending upon the composition of any particular glass material. Silicon may have a CTE of approximately 2.6 ppm, which again is temperature dependent. Organic polymer-based materials typically used in the construction of package substrates and circuit boards may have a CTE of approximately 12 or more (again, a value that is temperature and composition dependent). Although, as noted above, the CTE of a substance is temperature and composition dependent, the CTE mismatch between a silicon die and the underlying substrate is significantly reduced using a glass core substrate as compared to a polymer-based substrate material. In addition, glass may have a modulus, E, of approximately 75 GPA, whereas commonly used organic polymer-based materials may have a modulus of approximately 25 GPa (the value of E also being dependent upon the composition of a substance). Thus, a glass core substrate may provide a three-fold increase in modulus, which in some embodiments may provide the potential for a corresponding three-fold decrease in substrate warpage. A further advantage of glass is that it may be manufactured with more consistent flatness than common polymer materials.

The above-described reductions in CTE mismatch and warpage may enable the use of a smaller pitch for die-to-package interconnects, as well as a larger number of these interconnects, providing increase I/O capability. For example, in one embodiment, a pitch of 50 micrometers or less may be achieved for die-to-package interconnects when using a glass core substrate. Large substrate warpage may lead to non-contact-open failures in the die-to-package interconnects during the chip attach process, as well as leading to high stresses within the die itself (e.g., within the inter-layer dielectric layers, or ILD layers, of the die), both of which can result in lower reliability. Thus, the disclosed glass core substrate may enable the implementation of higher I/O packages while, at the same time, maintaining or improving reliability.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A substrate comprising:
a core comprised of amorphous solid glass, the amorphous solid glass core having a first surface and an opposing second surface;
a number of conductors extending through the amorphous solid glass core beginning at the first surface and ending at the second surface, wherein the number of conductors comprise an opening through the amorphous solid glass core filled with a single conductive material;
at least one dielectric layer and at least one metal layer disposed at the first surface of the amorphous solid glass core, wherein the at least one metal layer at the first surface is electrically coupled with at least one of the conductors;
at least one dielectric layer and a least one metal layer disposed at the second surface of the amorphous solid glass core, wherein the at least one metal layer at the second surface is electrically coupled with at least one of the conductors.

2. The substrate of claim 1, wherein the amorphous solid glass core comprises a single piece of glass.

3. The substrate of claim 1, wherein the amorphous solid glass core comprises two or more sections of glass joined together.

4. The substrate of claim 1, wherein each of the conductors comprises a hole formed in the amorphous solid glass core and an electrically conductive material disposed in the hole.

5. The substrate of claim 4, further comprising a wetting layer disposed on a wall of the hole.

6. The substrate of claim 4, wherein the electrically conductive material comprises a metal.

7. The substrate of claim 4, wherein a wall of the hole is tapered at an angle relative to a centerline of the hole.

8. The substrate of claim 1, wherein each of the conductors comprises a metal wire embedded in the amorphous solid glass core.

9. The substrate of claim 1, wherein the at least one metal layer disposed at the first surface of the amorphous solid glass core is disposed directly adjacent the first surface, and wherein the at least one metal layer disposed at the second surface of the glass core is disposed directly adjacent the second surface.

10. The substrate of claim 1, further comprising:
a first set of terminals disposed on at the first side of the amorphous solid glass core, the first set of terminals to mate with a corresponding array of terminals on an integrated circuit (IC) die; and
a second set of terminals disposed at the second side of the glass core, the second set of terminals to mate with a corresponding array of terminals on a next-level component.

11. The substrate of claim 1, wherein the amorphous solid glass is selected from the group consisting of pure silica, soda-lime glass, boro-silicate glass, and alumo-silicate glass.

12. The substrate of claim 1, wherein the amorphous solid glass is selected from the group consisting of fluoride glass, phosphate glass, and chalcogen glass.

13. The substrate of claim 1, wherein the amorphous solid glass includes additives selected from the group consisting of magnesium, calcium, manganese, aluminum, lead, boron, iron, chromium, carbonates thereof, and oxides thereof.

* * * * *

UNITED STATES PATENT AND TRADEMARK OFFICE
CERTIFICATE OF CORRECTION

| | |
|---|---|
| PATENT NO. | : 8,207,453 B2 |
| APPLICATION NO. | : 12/653710 |
| DATED | : June 26, 2012 |
| INVENTOR(S) | : Qing Ma et al. |

It is certified that error appears in the above-identified patent and that said Letters Patent is hereby corrected as shown below:

In column 18, line 1, delete "a least" and insert -- at least --, therefor.

Signed and Sealed this
Twenty-fifth Day of September, 2012

David J. Kappos
*Director of the United States Patent and Trademark Office*